United States Patent [19]

Moslehi

[11] Patent Number: 5,719,495
[45] Date of Patent: Feb. 17, 1998

[54] APPARATUS FOR SEMICONDUCTOR DEVICE FABRICATION DIAGNOSIS AND PROGNOSIS

[75] Inventor: Mehrdad M. Moslehi, Dallas, Tex.

[73] Assignee: Texas Instruments Incorporated, Dallas, Tex.

[21] Appl. No.: 658,435

[22] Filed: Jun. 5, 1996

Related U.S. Application Data

[62] Division of Ser. No. 131,046, Oct. 1, 1993, abandoned, which is a division of Ser. No. 638,468, Dec. 31, 1990, Pat. No. 5,270,222.

[51] Int. Cl.$^6$ .................................................. G01R 31/02
[52] U.S. Cl. .................... 324/158.1; 324/765; 324/753
[58] Field of Search ........................................ 324/750, 751, 324/752, 158.1, 73.1, 642; 356/73, 371; 437/8; 156/601, 626

[56] References Cited

U.S. PATENT DOCUMENTS

| | | | |
|---|---|---|---|
| 3,939,415 | 2/1976 | Terasawa | 324/158 D |
| 4,332,833 | 6/1982 | Aspnes et al. | 427/8 |
| 4,704,576 | 11/1987 | Tributsch et al. | 324/158 R |
| 4,949,034 | 8/1990 | Imura et al. | 324/158 R |
| 5,081,414 | 1/1992 | Kusama | 324/158 D |
| 5,091,320 | 2/1992 | Aspnes et al. | 437/8 |
| 5,270,222 | 12/1993 | Moslehi | 437/8 |
| 5,293,216 | 3/1994 | Moslehi | 356/371 |

FOREIGN PATENT DOCUMENTS

| | | |
|---|---|---|
| 57-130416 | 8/1982 | Japan. |
| 57-206045 | 12/1982 | Japan. |
| 60-124833 | 7/1985 | Japan. |
| 61-279131 | 12/1986 | Japan. |
| 61-287243 | 12/1986 | Japan. |
| 59-92528 | 5/1994 | Japan. |

*Primary Examiner*—Vinh P. Nguyen
*Attorney, Agent, or Firm*—Mark A. Valetti; Wade James Brady, III; Richard L. Donaldson

[57] ABSTRACT

A sensor (210) for diagnosis and prognosis of semiconductor device fabrication processes measures specular, scattered, and total surface reflectances and transmittances of semiconductor wafers (124). The sensor (210) includes a sensor arm (212) and an opto-electronic control box (214), for directing coherent electromagnetic or optical energy in the direction of semiconductor wafer (124). Opto-electronic control box (214) includes circuitry for measuring the amounts of laser powers coherently reflected from and transmitted through the semiconductor wafer (124) surface and the amounts of electromagnetic powers scatter reflected from and transmitted through the semiconductor wafer (124) surface. Specular, scattered, and total reflectance and transmittance as well as surface roughness values for semiconductor wafer (124) are determined based on measurements of coherent and scatter reflected and transmitted laser powers. The sensor (210) can also provide a go/no-go test of semiconductor fabrication process quality. A process control computer associates with the sensor (210) to respond to spectral reflectance and transmittance measurements yielding surface roughness and thickness measurements as well as diagnosis/prognosis analysis results and control signals.

5 Claims, 16 Drawing Sheets

REFLECTED OR TRANSMITTED ENERGY DISTRIBUTION PROFILES

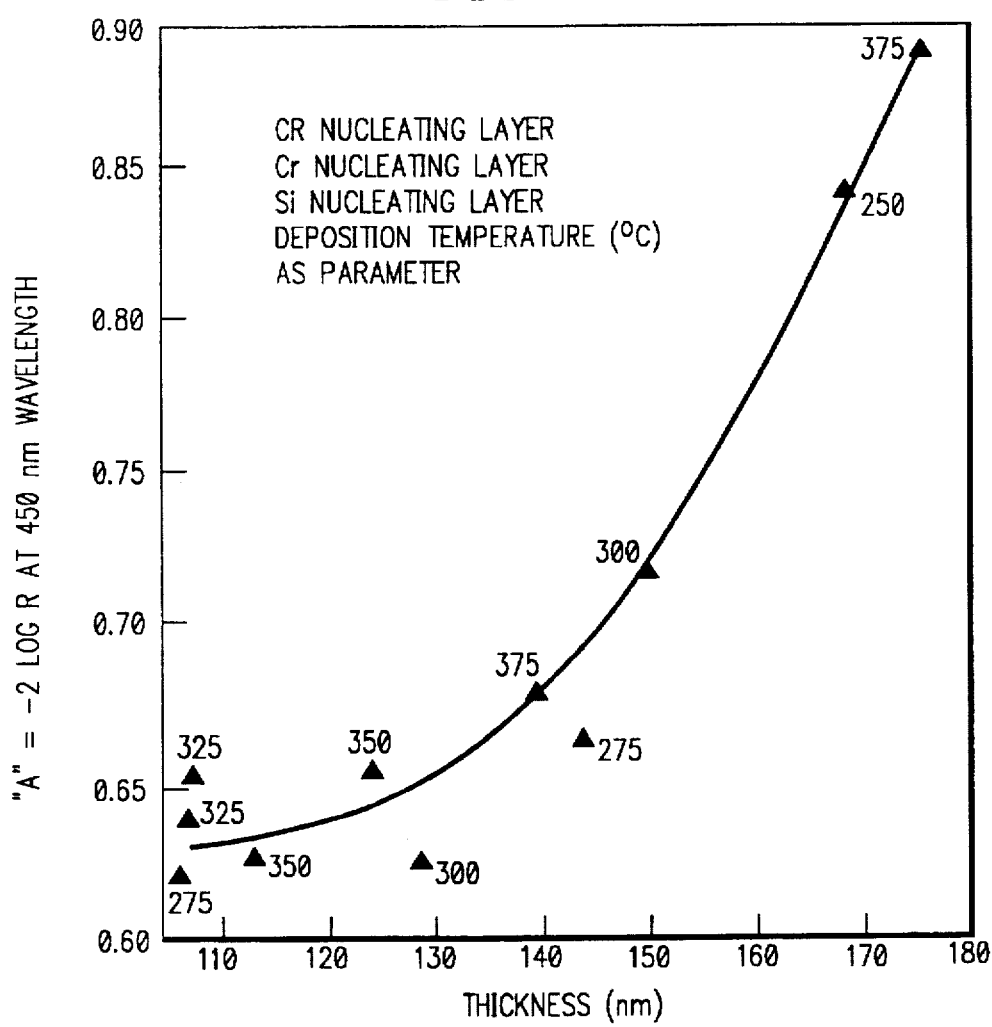
FIG. 14
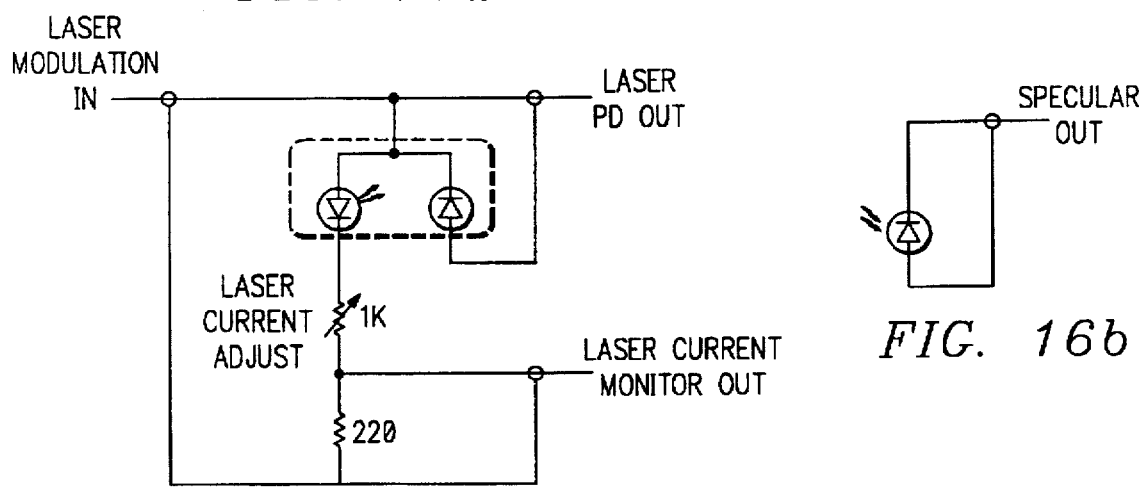
FIG. 16a
FIG. 16b

A ≡ DESIRED OPERATING POINT

APPARATUS FOR SEMICONDUCTOR DEVICE FABRICATION DIAGNOSIS AND PROGNOSIS

This is a divisional of application Ser. No. 08/131,046 filed Oct. 1, 1993, (now abandoned) which is a divisional of Ser. No. 07/638,468 filed Dec. 31, 1990, now U.S. Pat. No. 5,270,222.

NOTICE: THE U.S. GOVERNMENT HAS A PAID UP LICENSE IN THIS INVENTION AND THE RIGHT IN LIMITED CIRCUMSTANCES TO REQUIRE THE PATENT OWNER TO LICENSE OTHERS ON REASONABLE TERMS AS PROVIDED FOR BY THE TERMS OF A CONTRACT BETWEEN ASSIGNEE AND THE UNITED STATES AIR FORCE UNDER THE PROGRAM NAME MMST.

TECHNICAL FIELD OF THE INVENTION

The present invention generally relates to measurements of semiconductor wafer physical characteristics, and more particularly to a method and apparatus for non-invasive in-situ semiconductor wafer measurements for processing diagnosis and prognosis.

BACKGROUND OF THE INVENTION

Integrated circuit chip manufacturers fabricate semiconductor devices by sequentially applying patterned layers of usually not more than 1 µm thick to semiconductor wafers. The device layers may comprise various semiconductor or insulating layers in addition to one or more of the following conductive layers: a thin metal film such as tungsten, aluminum, copper, or titanium; a thin polycrystalline silicon (polysilicon) layer doped with impurities; or other layers of metal silicides and metal nitrides. Process control and manufacturing tolerances usually apply to the semiconductor device fabrication processes. Deviations from specified target tolerances in excess of only e few percentage points may result in defective and rejected semiconductor chips.

Semiconductor device manufacturers can only discard rejected semiconductor chips, thus resulting in undesirable production process waste and increased device manufacturing costs. If it is possible, however, to closely monitor various process and wafer parameters in situ during or immediately after processing each individual wafer, equipment and process inputs may be properly adjusted to reduce process parameter spread. Thus, a need exists for a method and apparatus to accurately measure physical parameters of a semiconductor wafer in situ for semiconductor wafer processing control and prognosis/diagnosis applications.

Methods for applying polycrystalline, amorphous, and single-crystal layers on semiconductor wafers include processes known as chemical-vapor deposition (CVD), evaporation, and other physical-vapor deposition (PVD) techniques such as sputtering. These thin-film deposition processes usually take place in a vacuum-tight deposition chamber filled with reactive process gases using thermal, plasma, or photo activation to generate the necessary species for deposition of the desired material layers. To maintain deposition uniformity across an individual semiconductor wafer surface, as well as process repeatability from wafer to wafer during the fabrication of many wafers, it is important to know the surface reflectance and roughness of the metal (or other polycrystalline) films deposited on the wafers. This is because for a given polycrystalline metal film thickness and metal film purity, a well-defined domain of surface reflectance and roughness values can be predicted. In the event that surface reflectance and roughness values fall outside the expected range of values, then the fabrication process may not be proceeding as expected even though the desired metal film thickness may be achieved. Examples of problems that would result in metal film surface reflectance and roughness values differing from expected values for a given metal film thickness are several. For example, CVD, evaporation, and other PVD processes usually operate within vacuum tight chambers. If vacuum integrity is not maintained in the process chamber, contaminants from the atmosphere external to the processing reactor may enter the process chamber. In such event, oxidation of the metal film or oxygen incorporation into the metal film will occur during deposition. Oxidation of the metal film (or oxygen incorporation) can change surface reflectance and roughness values for a given metal film thickness. As another example, it is important in many fabrication processes to prevent back-side film deposition on the semiconductor wafer. A measurement of surface reflectance of the semiconductor wafer back-side can indicate the presence or absence of metal or another material layer.

Therefore, there is a need for a non-invasive in-situ method and apparatus for measuring surface reflectance and roughness of semiconductor wafer in a device fabrication reactor.

There are no known low-cost and simple methods or apparatuses that use an in-situ non-invasive sensor for measurements of semiconductor surface reflectance and roughness to monitor the important physical parameters associated with the semiconductor wafer fabrication process. In particular, there is not presently an apparatus that can provide non-invasive in-situ post-process surface reflectance and scattering measurements for CVD metal films or other polycrystalline CVD and PVD films such as polycrystalline silicon. Moreover, although some sensor systems can provide surface reflectance measurements of semiconductor wafers, no known system can provide non-invasive in-situ reflectance and scattering measurements immediately following a CVD or other deposition processes. There does not exist a low-cost compact sensor that can fit easily within a semiconductor wafer processing reactor to provide non-invasive in-situ measurements of semiconductor wafer surface reflectance and scattering or roughness for wafer processing diagnosis and prognosis applications.

Thus, there is a need for a non-invasive sensor that can provide surface reflectance and scattering measurements of wafers with metal films, polycrystalline films, and in general other material layers.

There is a need for a non-invasive in-situ sensor for performing surface reflectance and scattering measurements of metal films and other material layers on a semiconductor wafer immediately after a deposition or an etch process.

There is yet a need for a low-cost compact sensor that can be configured to operate in situ within a semiconductor processing reactor to provide surface reflectance and roughness measurements. Moreover, there is a need for an inexpensive and compact system that can provide the above measurements for process control and diagnosis/prognosis applications.

SUMMARY OF THE INVENTION

The present invention accordingly provides an apparatus and method for non-invasive in-situ measurements of physical properties of metal and other material layers as well as semiconductor wafer surface roughness that substantially eliminate and reduce disadvantages and limitations associated with prior semiconductor wafer measurement methods, apparatuses, and systems.

One aspect of the invention is an electromagnetic or optical energy sensing device for semiconductor device manufacturing process control. The invention comprises an electromagnetic or optical beam energy source that, through associated circuitry, directs electromagnetic or optical energy in the direction of a semiconductor wafer. The electromagnetic or optical beam energy interacts with the semiconductor wafer. A portion of the energy is coherently or specularly reflected by the wafer in the specular direction. Depending on the amount of roughness of the semiconductor wafer surface and the incident beam wavelength, a fraction of the reflected electromagnetic or optical energy may be scattered in the non-specular directions. The sensor of the present invention includes circuitry for measuring the amounts of specular (coherent) and scattered (incoherent) electromagnetic or optical beam powers reflected from the semiconductor wafer surface. Circuitry within the present invention then determine semiconductor wafer surface reflectance based on measurements of the incident beam power, the coherently reflected beam power (specular reflection), and the scatter reflected electromagnetic beam power (scattered reflection).

U.S. Pat. No. 5,293,216 by Dr. Mehrdad M. Moslehi entitled "Sensor for Semiconductor Device Manufacturing Process Control" filed simultaneously with this application and issued on 8 Mar. 1994 describes a method and apparatus that utilizes a known relationship that has been found to exist between metal film or other polycrystalline film thickness and corresponding surface roughness. That application is incorporated herein in its entirety. By providing a direct measurement of polycrystalline film roughness, the invention of that application provides a method and apparatus for determining metal or other polycrystalline film thickness on a semiconductor wafer. With a known measured value of metal or other polycrystalline film thickness, it is possible to generate a graph of expected surface reflectance versus polycrystalline layer thickness or surface scattering parameter. Using the apparatus of the present invention, it is possible to measure actual surface reflectance (specular, scattered, and total) for the semiconductor wafer. Depending on the relationship between expected surface reflectance (e.g., total reflectance) and actual measured surface reflectance for a given polycrystalline film thickness, a go/no-go test is used to diagnose the existence of semiconductor wafer fabrication process abnormalities. Based on test results, a prognosis to correct possible process abnormalities can be generated. This example illustrates one possible mode of diagnosis/prognosis test among many possible modes of tests.

According to another aspect of the invention, there is provided a sensor system that includes a coherent electromagnetic or optical energy source that is configured to direct an incident energy beam perpendicular to (off-normal angles may also be used) and in the direction of a semiconductor wafer surface. Components of the present invention measure those specular portions of the optical or electromagnetic energy that are coherently reflected by and coherently transmitted through the semiconductor wafer. The present invention also includes components for measuring the non-specular portions of electromagnetic or optical energy that are scattered in both reflectance from and transmittance through the semiconductor wafer. Based on the measured amounts of electromagnetic or optical powers that are specularly reflected and scatter reflected by the semiconductor wafer, the present invention derives the specular, scattered, and total surface reflectance values. Similarly, the measured amounts of specularly transmitted and scatter transmitted beam powers are used to extract the specular, scattered, and total transmittance values. Based on semiconductor wafer electromagnetic reflectance and transmittance values, it is possible to determine the existence of semiconductor wafer back-side deposition of metal or polycrystalline films. These measurements can also be used to detect other possible process and equipment problems and drifts which can affect the deposited film quality and/or uniformity.

In the preferred embodiment of the present invention, the coherent electromagnetic energy source consists of a 1.3 µm semiconductor diode laser and fiber-optic circuitry which includes single-mode and multi-mode optical fiber transmission lines. For semiconductor wafer processing diagnosis and prognosis, in-situ measurements are taken post-process within the load-lock chamber of a deposition or etch semiconductor wafer processing reactor.

A technical advantage of the present invention is that it makes possible precise semiconductor device fabrication diagnosis and prognosis for process control and manufacturing yield enhancement. Because the method and apparatus are non-invasive and in situ, a process control computer can make continual adjustments during the processing of a large quantity of semiconductor wafers through a wafer processing reactor in response to post-process wafer surface reflectance and transmittance as well as optical scattering measurements.

BRIEF DESCRIPTION OF THE DRAWINGS

The invention and its modes of use and advantages are best understood by reference to the following description of illustrative embodiments when read in conjunction with the accompanying drawings, wherein:

FIG. 14 is a plot illustrating the effect of CVD tungsten deposition temperature and thickness on surface roughness and/or spectral reflectance;

FIGS. 16a and 16b are circuit diagrams for a semiconductor diode laser interface and specular photo-detector incorporating a preferred embodiment of the present invention;

DETAILED DESCRIPTION OF THE INVENTION

The preferred embodiment of the present invention is best understood by referring to the FIGUREs wherein like numerals are used for like and corresponding parts of the various drawings. In the description below, FIGS. 1 through 4 relate to the environment of the present invention. FIGS. 5 through 17 relate to the concepts of the invention, and FIGS. 18 through 22 show use and examples of implementation of the invention.

Semiconductor chip manufacturing factories usually employ well-established statistical process control (SPC) techniques to minimize the process parameter deviations and to increase the device fabrication yield. The conventional fabrication environments rely on controlling a limited set of critical equipment and process parameters (e.g., process pressure, gas flow rates, substrate temperature, radio frequency plasma power, etc.); however, most of the significant wafer, process and equipment parameters of interest are not monitored in real time or in situ. These critical parameters may include conductive layer sheet resistance values, film thicknesses, process uniformity, equipment cleanliness, and others. The existing commercial processing equipment usually lack suitable in-situ sensors for real-time process control and equipment diagnostics applications. In many cases, the wafer processing reactors have not been designed for convenient implementation of new in-situ monitoring sensors. As a result, the detrimental effects of any unexpected process parameter variations and equipment-related drifts are not detected in real time. The relatively long time delays between detection of process or equipment problems and implementation of suitable corrective measures increase the overall chip manufacturing costs.

Vacuum-integrated cluster tools consisting of single-wafer processing modules and in-situ sensors allow sequential integrated device processing in the computer-integrated manufacturing-or CIM-supervised factories. In-situ sensors improve the manufacturing cycle time by eliminating the need for many of the off-line pilot measurements and by enhancing the process and equipment reliability. Moreover, the in-situ sensors employed for equipment and process diagnosis/prognosis will increase the equipment/process up-time and improve the cluster tool reliability and functionality. Real-time in-situ process and wafer monitoring sensors also effectively reduce the process and device parameter spread and result in manufacturing yield improvements.

Figure 1:
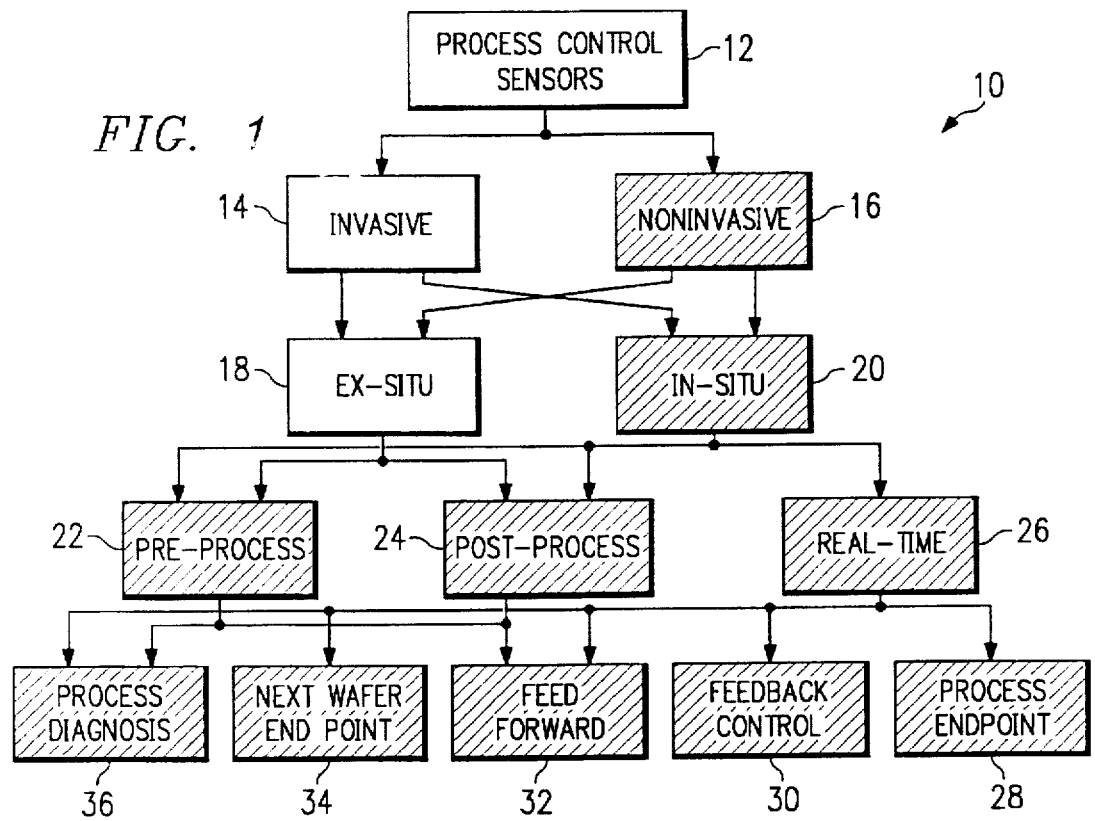
FIG. 1 is a hierarchical diagram of various types of process monitoring and control sensors used in semiconductor device fabrication processes.

FIG. 1 shows a sensor hierarchy 10 diagram for various semiconductor device processing applications. The shaded blocks represent the components which are the most suitable sensor types for advanced manufacturing process control. In general, the process control sensors 12 can be divided into the invasive 14 and non-invasive 16 groups. The invasive sensors 14 are intrusive to the process environment and/or wafer surface within the processing equipment and, as a result, are not suitable for in-situ process monitoring applications 16. For example, most contact-type sensors which require direct mechanical contact with the wafer surface (e.g., four-point probes for sheet resistance and thermo-couples for wafer temperature measurements) are invasive. On the other hand, the non-invasive in-situ sensors 20 are the most suitable type for device fabrication process control needs. These sensors usually employ non-invasive probe beams or characteristic detected beams of energy with well-defined physical signatures (e.g., optical, acoustical, electronic, and electromagnetic) to monitor the desired parameters based on a known physical phenomenon. The ex-situ sensors 18 are essentially for off-line pre-process 22 and post-process 24 monitoring applications; however, the in-situ sensors 20 are designed for real-time 26 as well as on-line pre-process 22 and post-process 24 monitoring and process control.

As indicated in FIG. 1, the real-time in-situ sensors 26 are employed for important tasks including process-end-point detection 28, real-time feedback control 30, and process/equipment diagnosis and prognosis 36. For instance, an in-situ real-time sheet resistance sensor can be used in conjunction with a metal CVD process module to provide feedback process control 30 (for instance, to control the deposition rate) and to achieve precise process end-point detection (stop the process whenever the layer sheet resistance is lowered to a pro-specified target value). The same sensor may also provide data to feed-forward links 32 (for instance, sheet resistance or thickness data to a metal etch module) and to expert systems for equipment and process prognosis/diagnosis purposes 36. The in-situ pre-process 22 and post-process 24 sensors are mounted within a load-lock chamber or a dedicated metrology module interconnected with the vacuum-integrated cluster tools. These sensors are useful for next-wafer (delayed) process and end-point control 34, feed-forward links 32, and equipment/process prognosis/diagnosis 36.

The specific choice of various types of in-situ sensors depends on factors such as the application area and cost. For instance, depending on the process application, the tasks of in-situ dielectric thickness measurement may either be performed in real time (for real-time rate control and/or end-point detection) or following the process by a post-process sensor (for delayed process control and feed-forward links). In general, it is easier and cheaper to design and implement in-situ for pre-process and post-process monitoring purposes compared to real-time in-situ sensors. This is due to the fact that some process modules may impose serious constraints in terms of suitable physical access to the process or wafer environments for implementation of multiple real-time sensors. For instance, real-time dielectric film thickness measurements during a thermal oxidation process are affected by the process temperature (due to the temperature-dependent refractive index values). It is, however, apparent that some tasks such as temperature measurement require real-time sensor operation to achieve meaningful process control.

Figure 2:
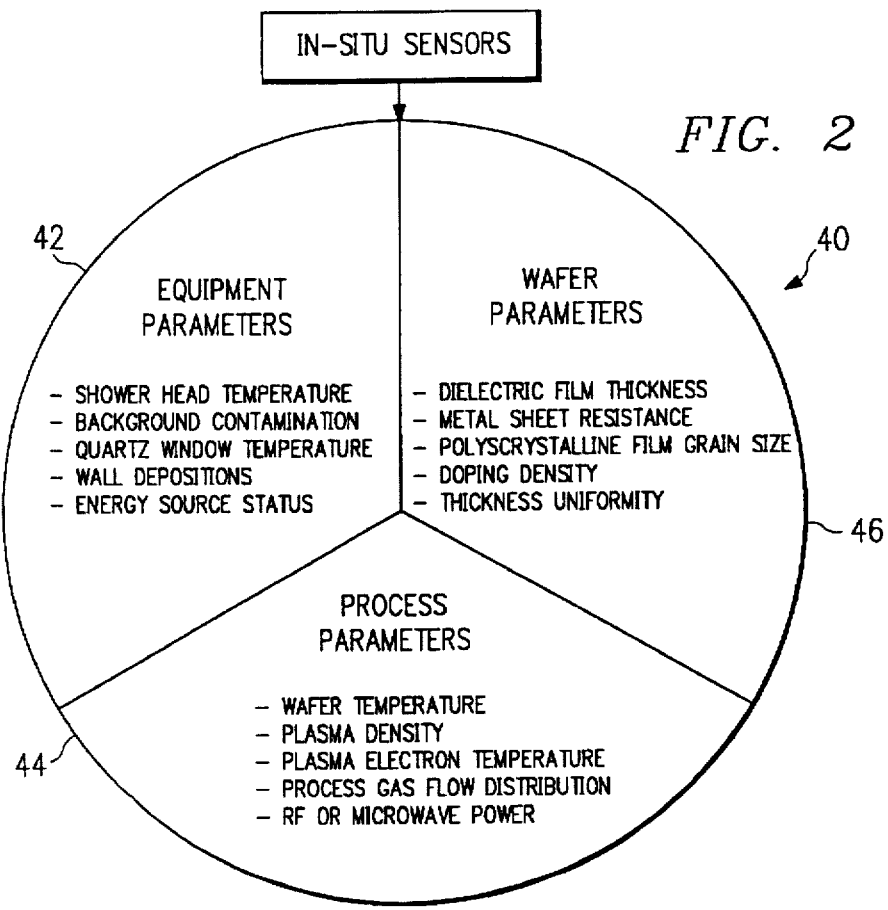
FIG. 2 is a schematic illustration of various parameter domains for semiconductor device manufacturing process control.

FIG. 2 is a schematic illustration of various process domains 40 for process controls using in-situ sensors. These domains associate with the equipment 42, process 44 and wafer 46 parameters. Depending on the specific application, the critical equipment parameters 42 to be monitored may include gas shower head temperature, background contamination, quartz window temperature, chamber wall depositions, and energy source status. Additional equipment parameters are the gas flow rate and pressure settings in a reactor. On the other hand, the process parameters 44 are directly governed by both controlled and uncontrolled equipment parameters.

Depending on a specific application, the process parameters 44 which require monitoring may be wafer temperature, process gas flow field, plasma density, and plasma electron energy. In general, a semiconductor wafer exposed to a process contains the most important parameters 46 which have to be controlled. This is due to the fact that the wafer parameters 46 have a direct impact on device performance and yield. For example, in a CVD or PVD (e.g., sputter deposition) process used for deposition of dielectric or conductive films, the important wafer-level parameters 46 may include film thickness, refractive index, stress, conductive layers sheet resistance and thickness uniformity.

Among the above-mentioned three parameter domains 40, the equipment parameters 42 are the easiest to monitor. The equipment parameters 42 can be directly adjusted and monitored by an operator, whereas the process 44 and wafer 46 parameters are usually dependent variables. Monitoring and control of the desired process 44 and wafer 46 parameters require specialized non-invasive in-situ sensors. Proper adjustments of process and wafer parameters are usually performed via varying the equipment parameters. The process parameters are functions of the equipment variables via equipment models and the wafer parameters are determined by the process parameters via process models.

The critical non-invasive in-situ process control sensors required for a given fabrication process are determined based on various considerations such as the impact of the specified process on the overall semiconductor device performance and fabrication yield. The process requirements for a given process indicate if any real-time and/or pre-process or post-process in-situ sensors must be utilized in order to meet the target specifications for process and wafer parameters.

FIG. 3 illustrates various single-wafer processes and their associated "critical" in-situ process control sensors. For example, consider an RTP module used for CMOS gate dielectric formation by rapid thermal growth processes. Thickness, growth temperature, and uniformity of gate dielectrics are the main critical wafer and process parameters which can influence the overall device performance and fabrication yield. As a result, one important sensor is a reliable real-time multi-point temperature sensor for closed-loop temperature control to improve process repeatability and uniformity. Moreover, another very useful sensor is an in-situ ellipsometer for post-process measurement of gate dielectric thickness and refractive index. This sensor will help to further reduce the overall gate dielectric thickness spread via delayed (next wafer) feedback.

An additional post-process in-situ sensor may be used for monitoring the gate dielectric thickness uniformity. The in-situ post-process uniformity sensor will assist in meeting the process uniformity specification and can provide delayed feedback process control information for process uniformity control, assuming the RTP module employs a multi-zone illuminator for dynamic and real-time uniformity control. If the temperature sensor monitors multiple points on wafer for dynamic uniformity control during the gate dielectric formation process, the post-process uniformity sensor will be non-critical.

Figure 3A:
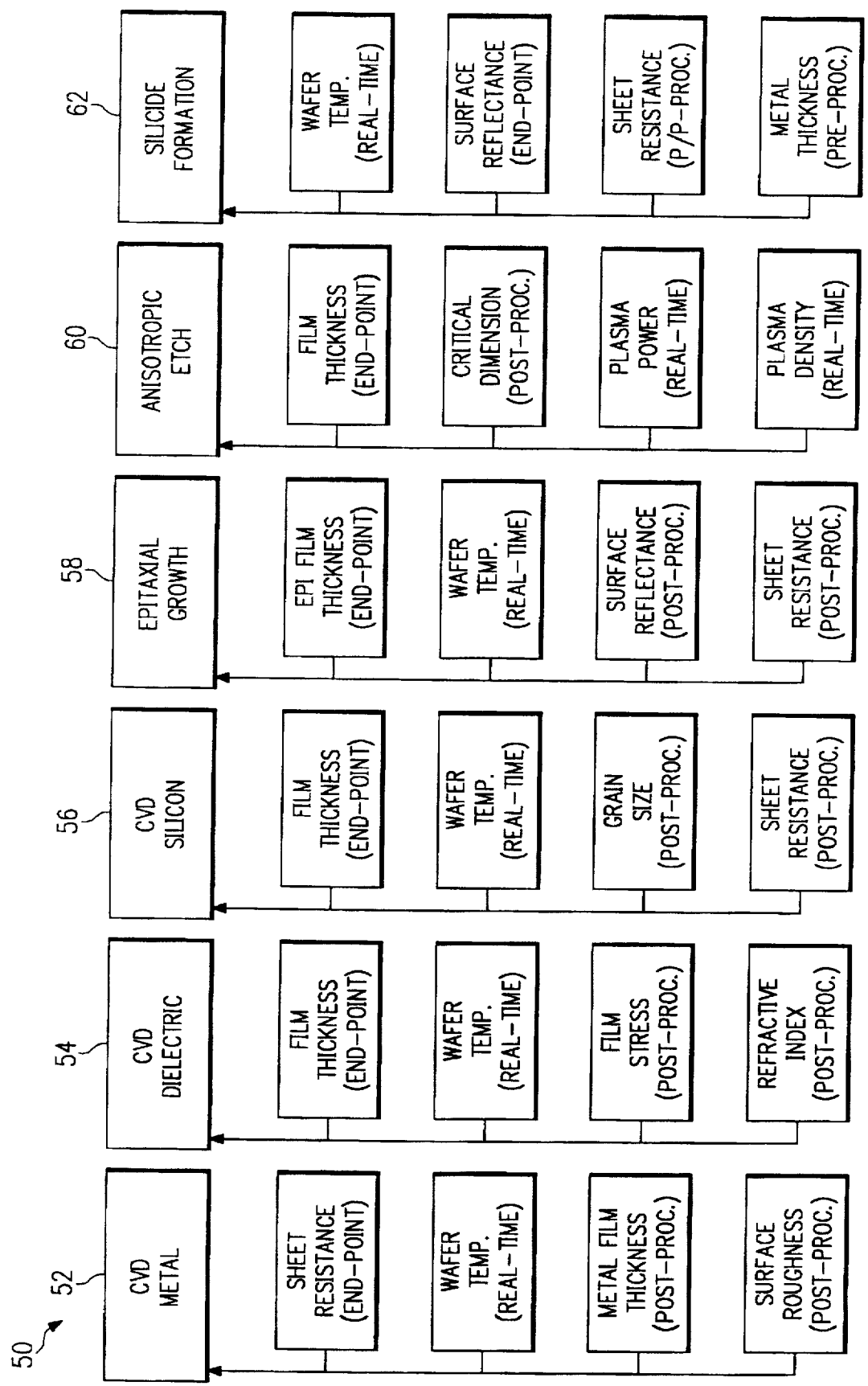
FIGS. 3a and 3b are charts describing useful in-situ sensors for process control in various semiconductor device fabrication processes.
Figure 3B:
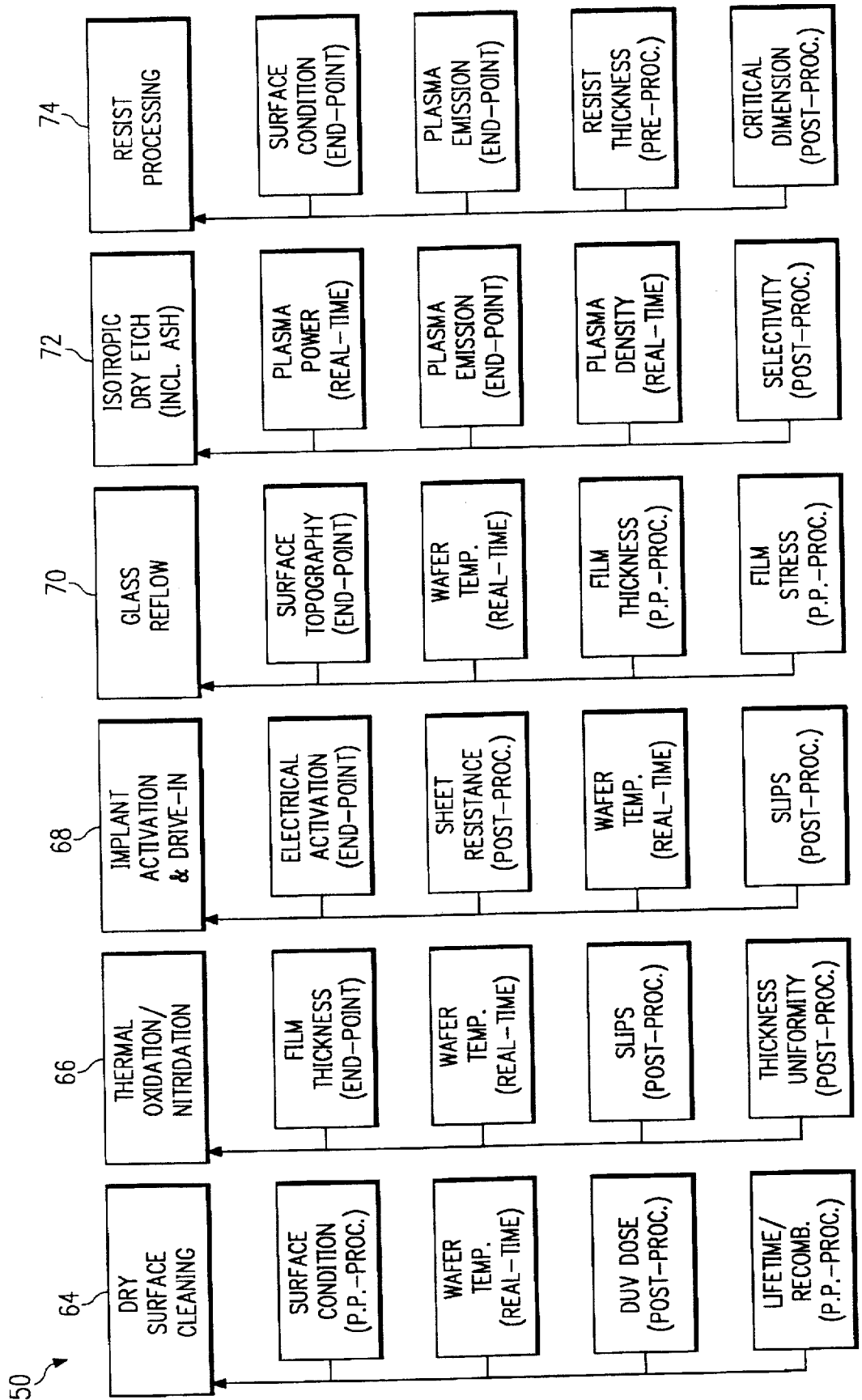

Various blocks shown in FIGS. 3a and 3b illustrate some suggested critical in-situ sensors (real-time as well as pre- and post-process sensors) for CVD processes (metals 52, dielectrics 54, amorphous and polycrystalline silicon 56), epitaxial growth 58, anisotropic plasma etch 60, silicide formation 62, dry surface cleaning 64, thermal oxidation/nitridation 66, ion implant processing 68, glass reflow 70, isotropic plasma etch 72, and resist processing 74. As an example, consider the critical sensor needs for metal CVD processes such as tungsten CVD using lamp-heated CVD modules. Again, a reliable temperature sensor is needed for real-time in-situ wafer temperature control (including uniformity control if a multi-zone illuminator is employed in conjunction with a multi-point temperature sensor).

Precise control of wafer temperature and its uniformity in the CVD tungsten temperature range (300° to 500° C.) is a critical requirement due to its impact on the deposition rate and process uniformity. Another very useful sensor is a non-invasive sheet resistance sensor for real-time in-situ monitoring of tungsten sheet resistance during the deposition process. The sensor will provide the process end-point information and will help to significantly reduce the process parameter spread. Besides these real-time sensors, the process can benefit from two post-process sensors for in-situ (but not real-time) monitoring of the metal film thickness and/or surface roughness.

The use of low-cost in-situ sensors in conjunction with single-wafer vacuum-integrated cluster tools can provide a flexible processing medium for high-yield manufacturing of advanced semiconductor devices. This type of factory relies on intelligent real-time process control based on extensive use of in-situ sensors to minimize the device parameter spread and to enhance the overall equipment reliability and process up-time.

Figure 4:
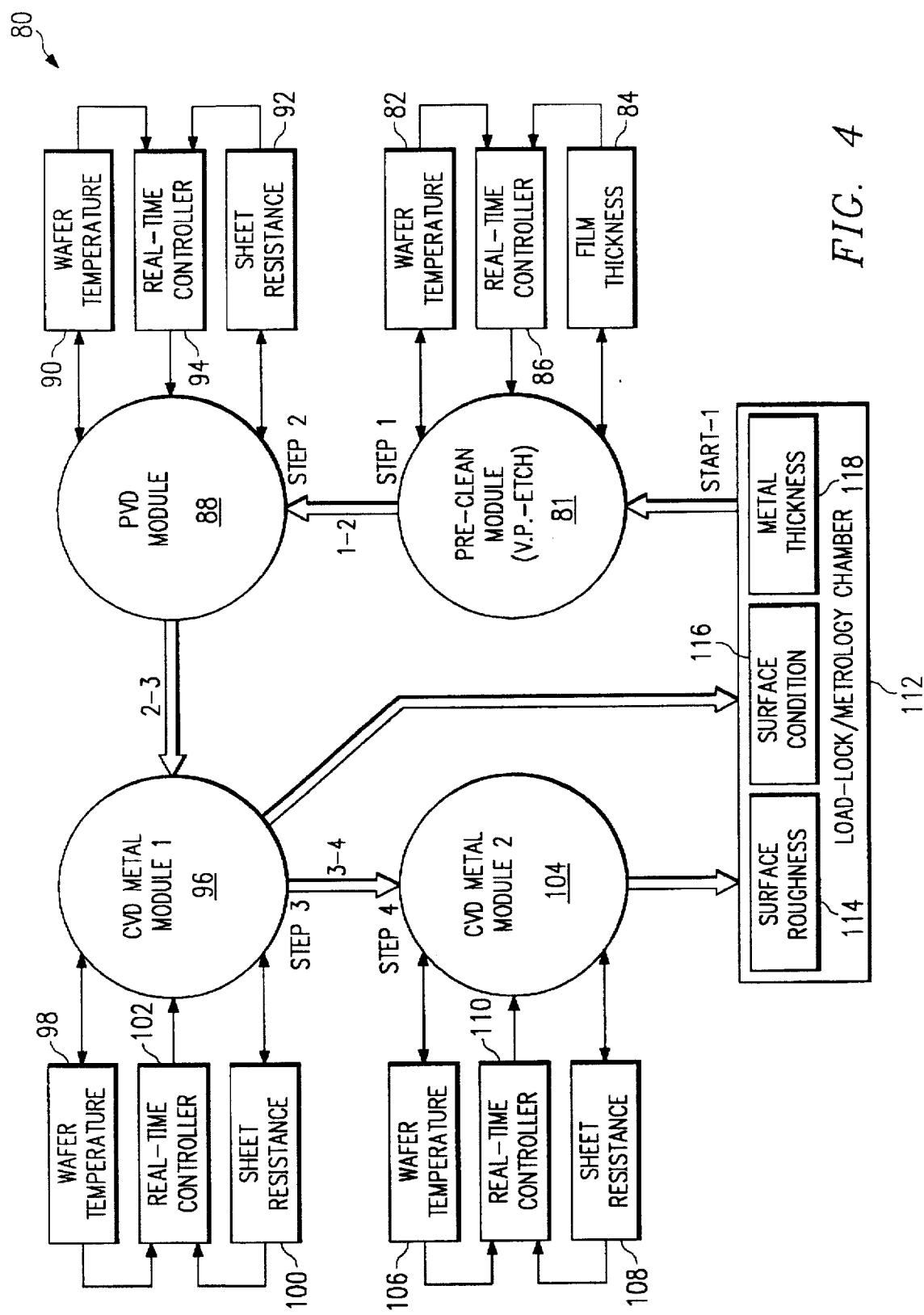
FIG. 4 is a schematic diagram of a representative cluster tool set-up for CMOS device metallization.

FIG. 4 is a schematic diagram of a cluster tool setup 80 for CMOS metallization. The process sequence for metal (such as tungsten metallization) starts with a pre-clean for native oxide removal and continues with applying a layer via physical-vapor deposition (PVD) or sputtering and a CVD metal layer such as CVD tungsten. The critical real-time sensors for this cluster tool are temperature sensors and sheet resistant sensors to determine process end-point. If necessary, one of the CVD metal chambers may be used for deposition of a barrier layer such as titanium nitride.

For the cluster tool setup 80 of the FIG. 4, the process begins at pre-clean module 82 for which wafer temperature and film thickness measurements take place. Inputs from wafer temperature sensor 82 and film thickness sensor 84 go to a real-time controller 86 which controls the pre-clean module 82. From pre-clean module 82, the next step takes place in a PVD module 88 which includes a wafer temperature monitor 90 and a sheet resistance monitor 92. These monitors input to a real-time controller 94 which controls the operation of the PVD module 88. The next step takes place in CVD metal module 1 96, which includes a wafer temperature sensor 98 and a sheet resistance sensor 100. These sensors input to the real-time controller 102 which controls the operation of CVD metal module 1 96. Next, CVD metal module 2 104 can perform additional CVD metal depositions on the semiconductor wafer. Wafer temperature monitor 106 and sheet resistance monitor 108 take measurements of the semiconductor wafer and feed those values into real-time controller 110. Following processing in CVD metal module 2 104, the semiconductor wafer returns to load-lock/metrology chamber 112. Within load-lock/metrology chamber 112, surface roughness 114 and surface condition 116 measurements are taken. Also, in load-lock/metrology chamber 112, metal thickness measurements 118 are taken and the cycle begins again at pre-clean module 82. Within the load-lock/metrology chamber of a fabrication reactor such as that of FIG. 4, in-situ semiconductor wafer measurements make possible precise process control and end-point determinations.

The method and apparatus of the present invention use coherent optical or electromagnetic energy beam as the medium for measuring semiconductor wafer parameters. By understanding and measuring how a semiconductor wafer affects coherent optical/electromagnetic energy, it is possible to extract properties of the semiconductor wafer and deposited films. An important feature of a semiconductor wafer that affects incident optical or electromagnetic energy is the semiconductor wafer surface condition.

Figure 5:
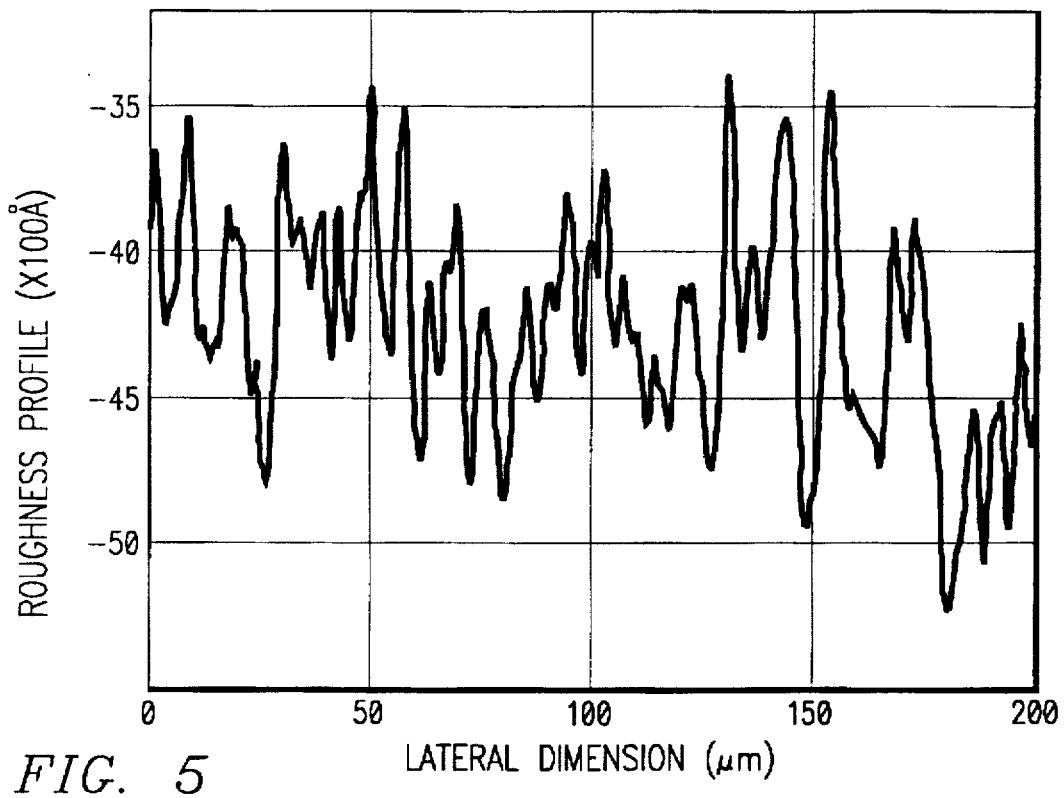
FIG. 5 is a plot of surface roughness measurement for a layer of chemical-vapor deposited or CVD tungsten on a semiconductor wafer.
Figure 6:
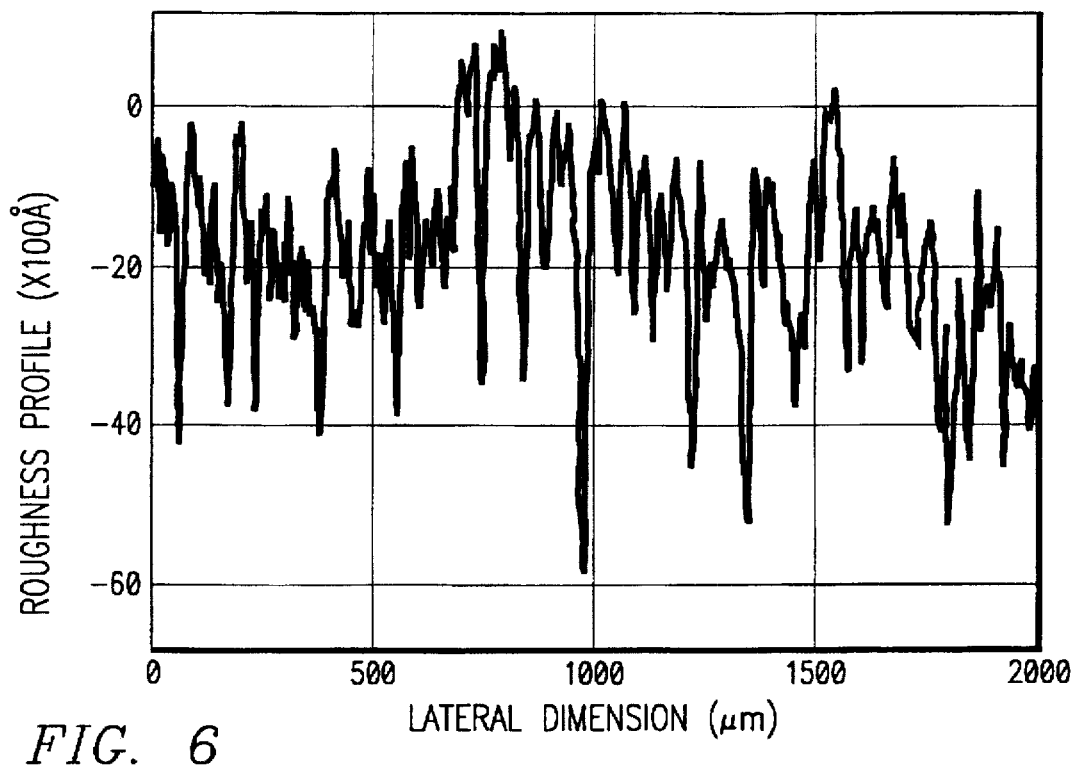
FIG. 6 is a plot of semiconductor wafer backside surface roughness measurement.

FIGS. 5 and 6 illustrate examples of measurements of surface roughness values for a CVD tungsten film deposited on the semiconductor wafer and the unpolished backside surface of a semiconductor surface, respectively. The plot of FIG. 5 shows along the ordinant CVD tungsten RMS surface roughness ranging from approximately −3500 to −5000 Å and along the abscissa lateral distance from left to right ranging from 0 to 200 µm. As FIG. 5 illustrates, the CVD tungsten film has a rough surface due to its polycrystalline phase. FIG. 6 illustrates a similar surface roughness profile measurement of silicon wafer backside surface shown between 0 and −6000 Å versus the semiconductor wafer backside lateral distance ranging from zero to approximately 2,000 µm. The measurements of FIGS. 5 and 6 illustrate relatively rough surfaces on the CVD tungsten film as well as on the unpolished backside of the silicon wafer itself. It is these rough surfaces that affect coherent electromagnetic or optical beam reflectance and transmittance. Thus, by measuring the affect that surface roughness has on the specular or coherent surface reflectance and/or transmittance values, it is possible to measure the average or RMS surface roughness itself.

Figure 7:
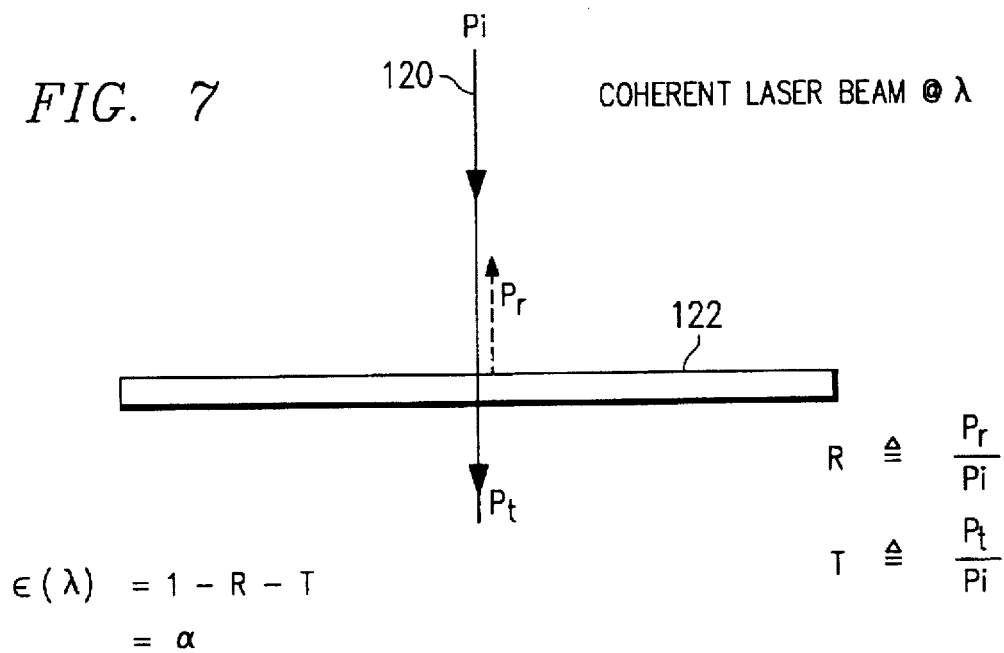
FIG. 7 is a schematic diagram illustrating the relationship among spectral emissivity, reflectance, and transmittance values for a highly polished semiconductor wafer.

FIG. 7 is a schematic diagram illustrating the relationship between emissivity and reflected and transmitted power components for a highly polished semiconductor wafer surface. A coherent electromagnetic or optical energy source, such as a laser beam 120 having a wavelength λ directs a beam of power, $P_i$, onto semiconductor wafer. A portion, $P_r$, of the incident power is reflected (offset for illustration only) by the wafer and a portion, $P_t$, may be transmitted through the semiconductor wafer. The spectral surface reflectance, R, is defined by the following relationship:

$$R \equiv \frac{P_r}{P_i} \quad (1)$$

The spectral transmittance, T, through the semiconductor wafer is defined by the following relationship:

$$T \equiv \frac{P_t}{P_i} \quad (2)$$

The spectral emissivity, ε, of semiconductor wafer 122 for a given coherent laser beam 120 wavelength, λ, is given by the following relationship:

$$\epsilon(\lambda) = 1 - R - T \quad (3)$$
$$= \alpha$$

where α is semiconductor wafer 122 absorption coefficient for the laser beam 120 of wavelength λ.

Figure 8:
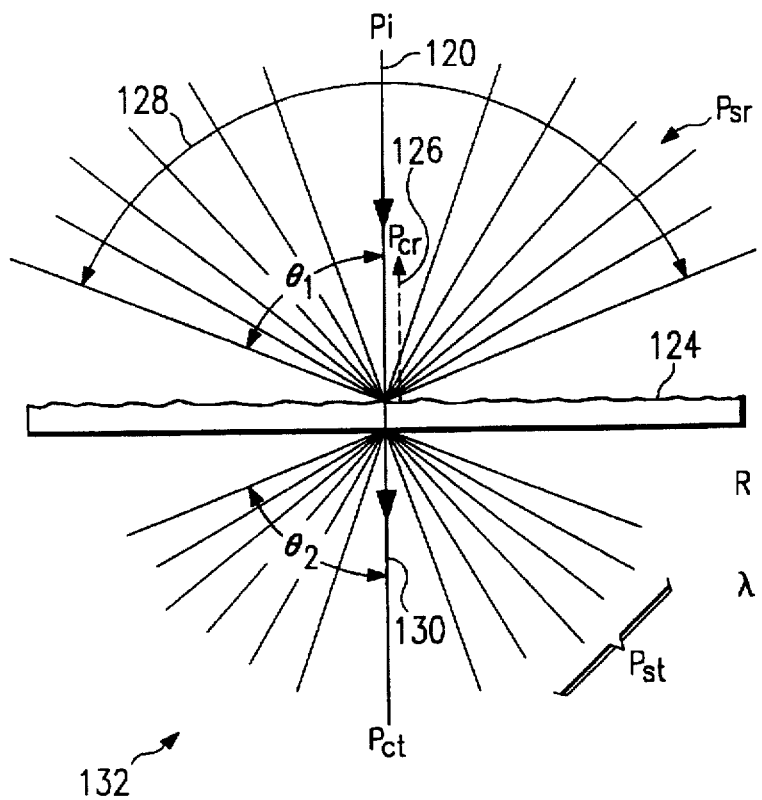
FIG. 8 is a schematic diagram illustrating the specular and scattered components of the reflected and transmitted beams on an unpolished semiconductor wafer with a rough surface.

FIG. 8 illustrates the situation with an unpolished semiconductor wafer 124 (wafer with one or two unpolished surfaces). Again, a coherent laser beam 120 of wavelength, λ, directs a beam of power, $P_i$, in the direction of unpolished semiconductor wafer 124. A fraction of the incident power is coherently reflected in a specular beam 126 direction (offset for illustration only) having a power, $P_{cr}$. A portion of incident beam 120 is scattered and reflected from the semiconductor wafer surface over a span 128 having a half angle, $\theta_1$, and a reflected power, $P_{sr}$. Also, a fraction of the incident power may transmit through semiconductor wafer 124. Of that amount, a specular beam 130 of coherent energy and a power, $P_{ct}$, directly emits from the opposite side of the semiconductor wafer 124. The remainder of the transmitted beam energy is scattered by the semiconductor wafer 124 with a scatter beam 132 having a half angle, $\theta_2$, and a transmitted power, $P_{st}$.

From the reflective powers, $P_{sr}$ and $P_{cr}$, a scattering ratio, $S_r$, can be defined as follows:

$$S_r \equiv \frac{P_{sr}}{(P_{sr} + P_{cr})} \quad (4)$$

Similarly, from the transmitted powers $P_{st}$ and $P_{ct}$, a transmitted scattering ratio can be determined as follows:

$$S_t \equiv \frac{P_{st}}{(P_{st} + P_{ct})} \quad (5)$$

To quantify the relationships that exist in the case of a rough or unpolished semiconductor wafer, there are two terms of interest. The first is the root-mean-square (RMS) surface roughness, ρ, which is an effective measure of the peak-to-peak variation in surface height. The second variable is called the "coherent length" or "surface coherent length". The coherent length is the scale of the lateral distance over which the roughness profile exists. Empirically, however, from wafer to wafer, the surface roughness varies much more than does the coherent length. Moreover, the coherent length is usually a variable which is dependent on the RMS surface roughness. Consequently, the RMS surface roughness is the main parameter interest in determining semiconductor wafer and CVD film surface roughness measurements.

If the RMS surface roughness, ρ, is much less than the wavelength, λ, of the coherent laser beam, then the total coherent (specular) and scattered reflectance, $P_{cr}$ and $P_{sr}$, respectively, will add to the total reflective power of a similar wafer but without any surface roughness. If, however, ρ is not much less than the laser wavelength, λ, the net total reflectance of the wafer with at least one rough surface may be different from that of a similar wafer but with polished surfaces. The same considerations are true for the transmittance and emissivity values.

Figure 9:
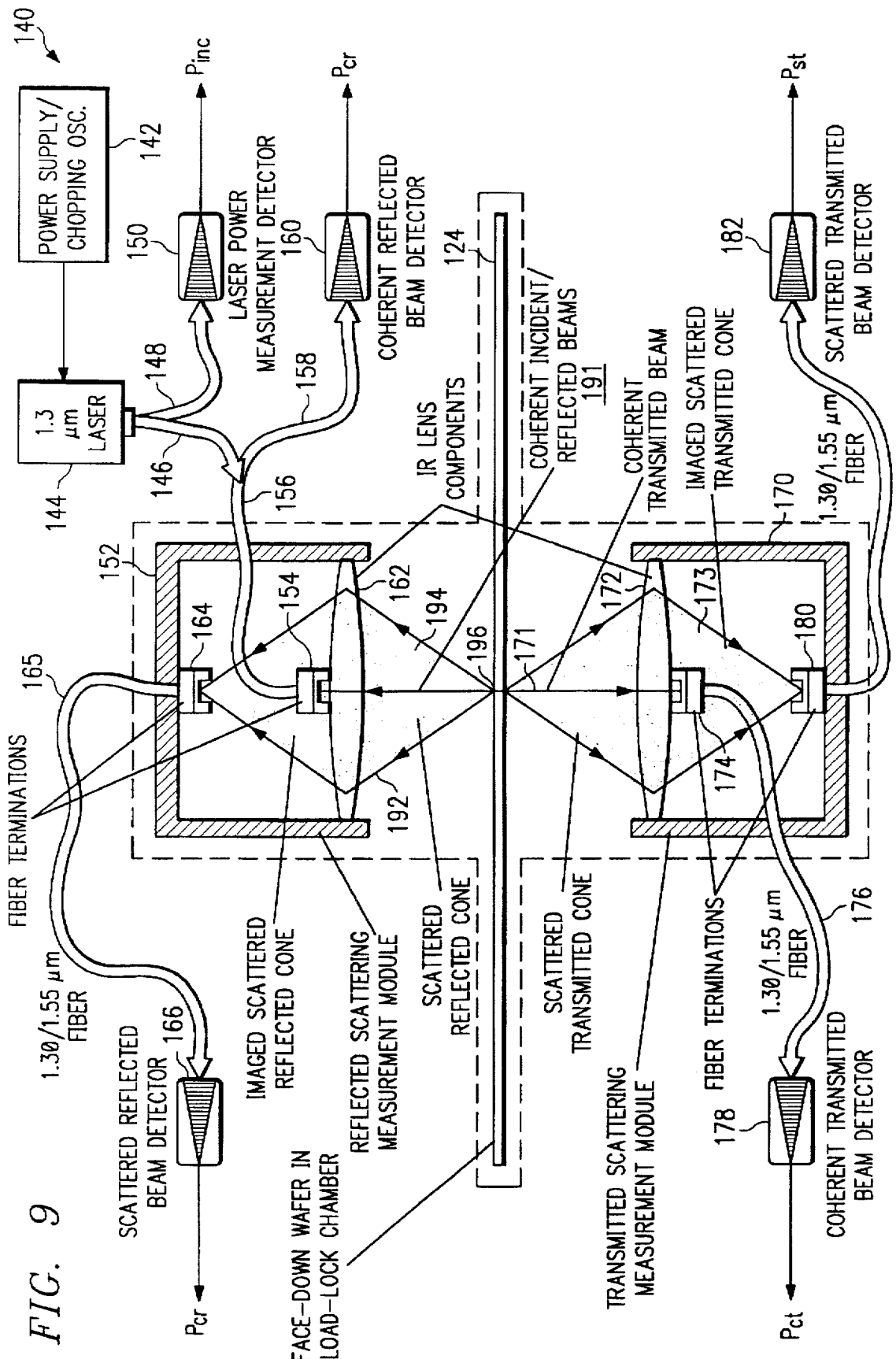
FIG. 9 displays a preferred embodiment of the present invention.

Having explained the relationship between incident coherent electromagnetic energy and a semiconductor wafer, an explanation of the present invention which is a method and apparatus embodying these concepts follows. FIG. 9 displays a schematic diagram of a preferred embodiment 140 of the present invention. In FIG. 9, power supply/ chopping oscillator 142 provides power to 1.3 µm diode laser 144. Laser 144 emits a coherent 1.3 µm laser beam to fiber-optic cable 146. Single-mode fiber optic cable 146 branches to line 148 which connects to laser power measurement detector 150 (a directional coupler may be used instead of the fiber bundle design). Elements within the dash line of FIG. 9 may be placed within a vacuum load-lock chamber. Laser power measurement detector 150 provides a measurement of the input coherent power, $P_{inc}$. Single-mode fiber-optic cable (optical fiber) branch 146 continues as part of fiber-optic cable 156 (fiber bundle) through reflected sensor measurement module 152 to fiber termination 154. Fiber bundle 156 contains two optical fibers: a single-mode fiber to guide the incident laser beam generated by laser source 144, and a collecting fiber (multi-mode or single-mode) to collect the coherently reflected laser beam. The collecting fiber continues to become optical fiber 158 and connects to coherent reflected beam detector 160. In the preferred embodiment, reflected sensor module 152 is positioned above semiconductor wafer 124 (face-up or face-down wafer). Fiber termination 154 transmits and receives coherent laser energy. The termination 154 includes a single-mode fiber for delivering the laser beam and another (multi-mode) fiber for collecting the specular reflection beam. A small lens (e.g., less than 2 mm in diameter) is used to collimate the incident beam and to focus the specularly reflected beam onto the collecting fiber. That portion of the laser energy (specular reflection) which fiber termination 154 receives is fed through optical cable 158 which splits off from optical cable 156. After splitting off, fiber optic cable 158 (collecting fiber for coherently reflected laser beam) provides a detected specular reflected laser beam signal to coherent reflected beam detector 160. The detected laser beam signal provides a measurement of the coherent or specular reflected power, $P_{cr}$. Within reflected beam measurement sensor module 152 fiber termination 154 includes a small collimating lens (not shown). This lens provides a collimated incident laser beam perpendicular to the wafer 124 surface. It also collects and focuses the specular or coherently reflected beam onto the core of a collecting fiber for measurement of the coherent reflected laser beam.

Fiber termination 154 rests on infrared imaging lens 162. Scattered beam imaging lens 162 rigidly mounts within reflected beam measurement sensor module 152 and focuses the scattered portion of the reflected laser power onto fiber termination/collector 164. Reflected beam measurement sensor module 152 also includes fiber termination 164 for receiving scatter reflected energy. The scatter reflected beam fiber termination/collector 164 connects to collecting optical fiber 165 (multi-mode fiber). This fiber 165 guides scatter reflected optical power to scatter reflected beam detector 166. In the preferred embodiment of the present invention, scatter reflected beam detector 166 may be directly and integrally mounted to reflected beam measurement sensor module 152. This allows direct collection and measurement of the scatter reflected beam power without any need for optical fiber 165. Scatter reflected beam detector 166 provides a power signal, $P_{sr}$, to measure the amount of scatter reflected power within reflected beam measurement sensor module 152.

Below semiconductor wafer 124 appears transmitted beam measurement module 170 which is essentially similar to the reflected beam measurement sensor module 152. Transmitted beam measurement sensor module 170 includes scattered beam imaging lens 172 upon which mounts fiber termination and beam collector 174. Fiber termination 174 connects through optical fiber 176 (multi-mode fiber preferred) to coherent transmitted beam detector 178. Termination 174 consists of a small focusing lens which guides transmitted specular beam 171 power into optical fiber 176. Coherent transmitted beam detector 178 provides a measure of coherent (or specular) transmitted power, $P_{ct}$. Fiber termination 180 also mounts within transmitted beam measurement sensor module 170 to collect and measure the amount of scattered transmitted beam received from semiconductor wafer 124. Fiber termination 180 collects and guides scattered transmitted beam 173 to scattered transmitted beam detector 182 through multi-mode optical fiber 181. Scattered transmitted beam detector 182 provides an output power signal, $P_{st}$, representing the amount of scattered laser power transmitted through wafer 124. An alternative (preferred) embodiment mounts scattered transmitted beam detector 182 directly on transmitted beam measurement sensor module 170, eliminating the need for optical fiber 181.

Within fiber terminations 154 and 174, a collimating lens collimates the incident laser beam exiting the transmitting fiber. Although the beam from laser 144 was initially collimated, because of multiple reflections within transmitting optical fiber running through branches 146 and 156, there is some beam divergence, typically on the order of 10°–20° half angle upon leaving fiber termination 154. The exact amount of beam divergence depends on the numerical aperture of the fiber. The small collimating lens at fiber termination 154 causes the divergence of the incident laser beam to be significantly reduced so that the beam comes out as a small diameter (e.g., 2 mm) parallel collimated beam with very law divergence. The small collimating/focusing lens at reflected beam fiber termination 154 also collects and focuses the coherently reflected laser beam onto the receiving fiber connected to coherent reflected beam detector 160. Similarly, a small focusing lens at transmitted beam fiber termination 174 collects and focuses the coherently transmitted laser beam 171 onto the transmitting fiber 176 connected to coherent transmitted beam detector 178. Each of the collimating and focusing lenses is small relative to the scattered beam imaging lenses. For example, if the beam that fiber termination 154 emits has a diameter of 1.4 mm, as is the case in the preferred embodiment, its collimating lens should have a diameter of approximately less than 2 mm. Thus, it will be slightly larger than the beam diameter in order to collect all of the coherent or specular beam reflected from semiconductor wafer 124 and to prevent it from spilling over into fiber termination 164. This will ensure negligible signal cross-talk between the specular and scattered detectors. If fiber termination 164 receives some coherent reflected power, as well as scatter reflected power, erroneous scattered reflected beam power measurements will result. The small fiber termination and lens diameters of the termination components 154 and 174 help to minimize shadowing of the scattered reflected and scattered transmitted laser beams. This condition ensures maximum and effective scattered optical signal collection in the reflection and transmission sensors.

Imaging lenses 162 and 172 are each sufficiently large to effectively collect and focus the respective cone of scattered reflected or transmitted optical beams from semiconductor wafer 124.

Figure 10:
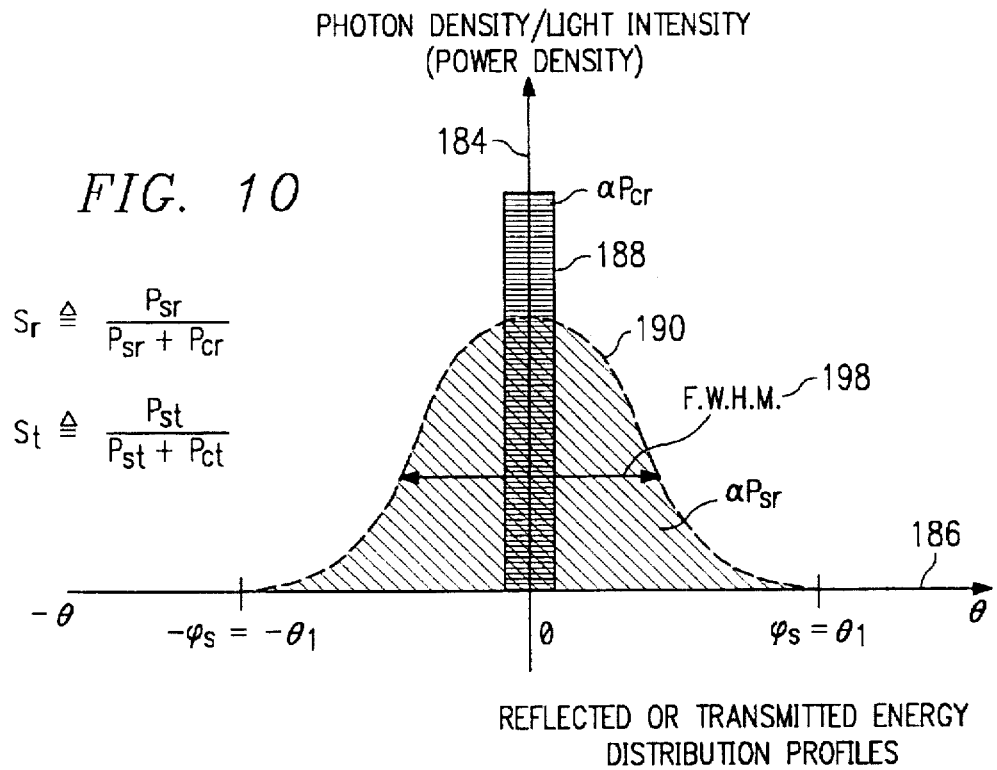
FIG. 10 is a schematic diagram illustrating the spatial distributions of the specular and scattered beam components of the reflected or transmitted optical power versus angle from the specular (perpendicular) direction.

It is helpful to understand the type of signal that imaging lens 162 of scatter reflected module 152 receives to more fully appreciate the present invention. FIG. 10 provides a qualitative plot of the spatial distribution of specular and scattered layer light intensities that reflected beam measurement sensor module 152 receives in response to reflection from semiconductor wafer 124 with a rough backside surface. With the ordinate 184 representing photon density/light intensity and abscissa 186 representing the half space angle from the normal vector to the semiconductor wafer at the point of laser beam incidence (or specular direction), FIG. 10 shows that within a very small angle from the normal, the photon density/light intensity 188 that semiconductor wafer reflects is a measure of the specular or coherent surface reflectance. This value is proportional to the coherently reflected power, $P_{cr}$. FIG. 10 also shows that between the half angle of $\pm\theta_1$ appears a Gaussian (or near Gaussian) distribution of photon density/light intensity. The integrated value of photon density/light intensity within bell curve 190 is proportional to the scattered reflected beam power, $P_{sr}$. Momentarily referring to FIG. 9, it can be seen that the half angle $\pm\theta_1$ is approximately the angle between the line connecting the point 196 of incident laser beam $P_i$, and the outer edge of the scatter reflected energy cone 194 on scattered beam imaging lens 162 and the specular vector normal to the semiconductor wafer at point 196. Returning to FIG. 10, therefore, the Gaussian distribution has the full-width half-maximum value 198 approximately as indicated.

An important relationship exists between the RMS surface roughness, $\rho$, the laser beam wavelength, $\lambda$, and the amount of light scattering. If the ratio, $\rho/\lambda$, approaches zero (very large $\lambda$ and/or very small roughness), which occurs when the semiconductor wafer surface becomes increasingly smooth or polished, the scattered reflected beam power approaches zero. Consequently, $P_{sr}$ approaches zero and the scattering ratio, $S_r$, approaches zero.

When absorption and transmission takes some of the incident beam power and $P_{sr}$ approaches zero, $P_{cr}$ approaches its maximum value for a given total surface reflectance. Conversely, as $\rho/\lambda$ becomes increasing large, which occurs when surface roughness increases, the total value of $P_{sr}$ increases for a given total surface reflectance of the semiconductor wafer. In any case, as $\rho/\lambda$ becomes increasingly large, coherently reflected power, $P_{cr}$, approaches zero (almost all of the reflected power is scattered).

Figure 11:
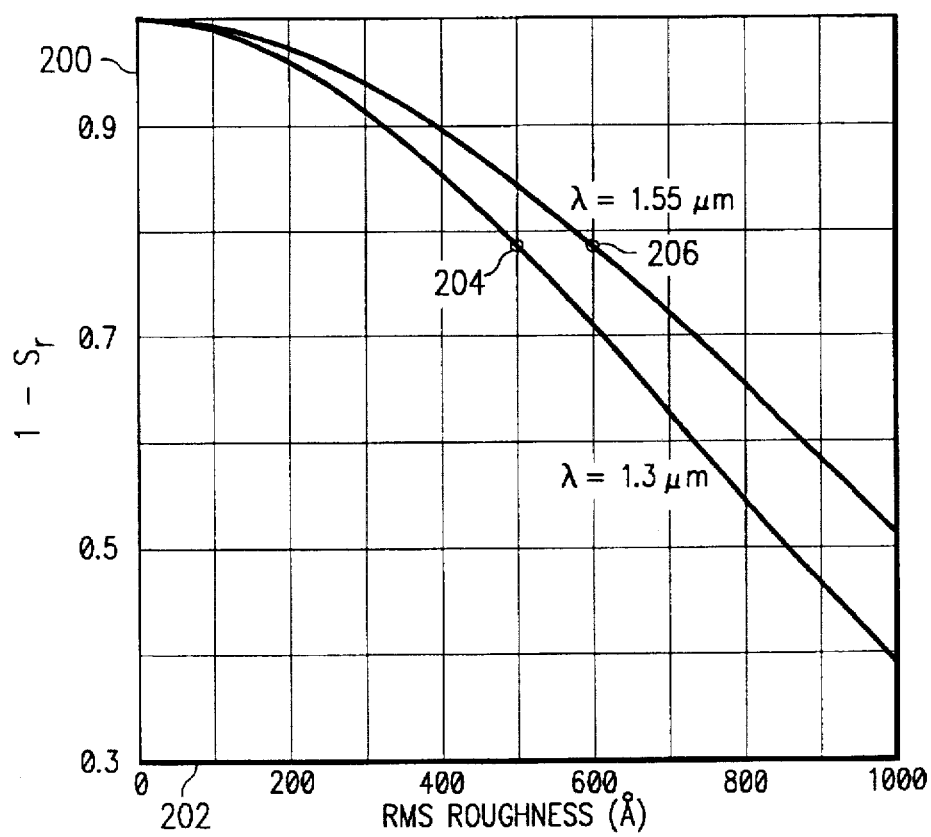
FIG. 11 is a calculated plot of one minus the scattering parameter obtained by reflectance measurements versus root-mean-square (RMS) surface roughness of a semiconductor wafer at room temperature (1−$S_r$, where $S_r$ is the scattering parameter for reflected light beam)

Because $P_{sr}$ and $P_{cr}$ vary as functions of the ratio $\rho/\lambda$, the scattering parameter, $S_r$, can be used to determine the ratio $\rho/\lambda$. For a given wavelength, $\lambda$, and measured scattering parameter, $S_r$, it is possible to determine the RMS surface roughness, $\rho$. FIG. 11 provides a calculated plot of the scattering versus roughness relationship for a laser wavelength $\lambda$ of 1.3 μm and also a laser wavelength of 1.55 μm. Along the ordinant 200 of FIG. 11 and ranging from 0.3 to 1.0 appear values for the quantity $1-S_r$, where $S_r$ is the reflectance scattering parameter. Along the abscissa 202 are values of the semiconductor wafer or CVD film RMS surface roughness, $\rho$, ranging from zero to 1,000 Å. The calculations for the plot of FIG. 11 were performed for room temperature.

An example of the use of FIG. 11 is as follows. Take, for example, the curve associated with the laser beam having a wavelength of 1.3 μm and a measured value of the one-minus-scattering parameter, $1-S_r$, of 0.79. The plot of FIG. 11 provides an extracted RMS surface roughness of 500 Å indicated at point 204. Likewise, with a laser beam wavelength of 1.55 μm, the same one-minus-scattering parameter value of approximately 0.79 provides an RMS surface roughness value of 600 Å at point 206. The representative calculated chart of FIG. 11 shows that as RMS roughness ranges from zero to 1,000 Å, $P_{sr}$ increases, causing the scattering parameter $S_r$ to increase to approach 1, thus making $1-S_r$ smaller.

Figure 12:
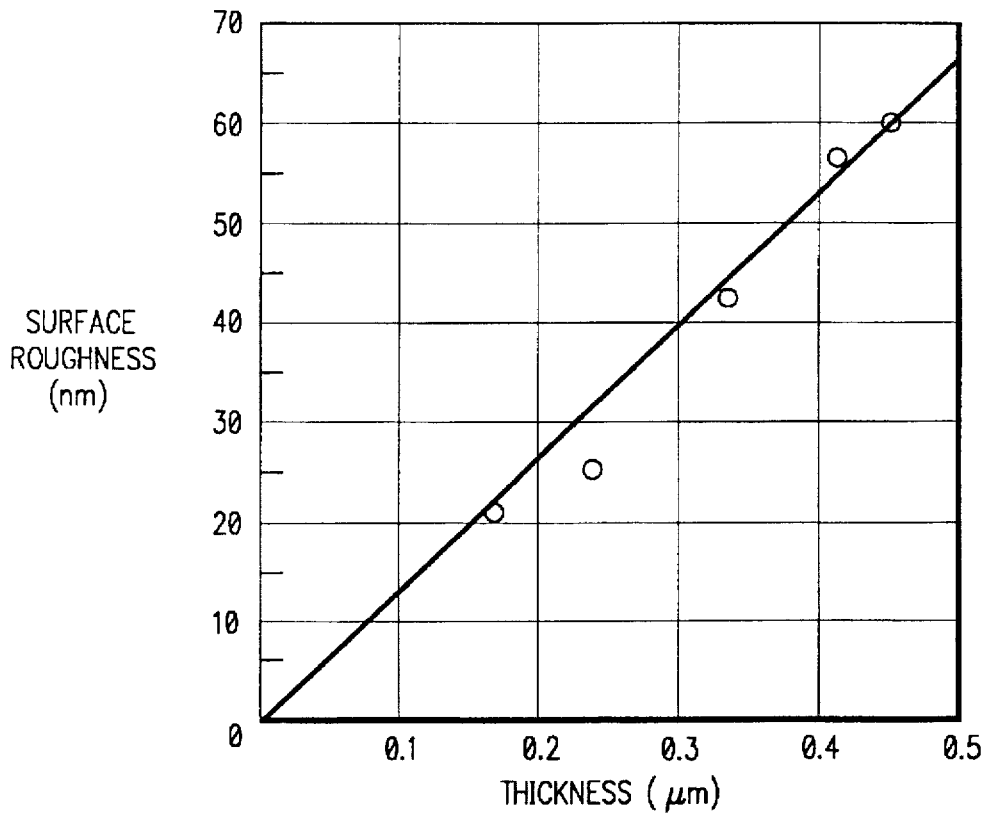
FIG. 12 is a plot of RMS surface roughness for chemical-vapor deposited or CVD tungsten versus film thickness (measured data points from literature)

In T. I. Kamins, et al. "Structure of LPCVD Tungsten Films for IC Applications," *J. Electrochem. Soc.*, December 1986, p. 2555 (hereinafter "KAMINS"), it is shown that when tungsten is deposited on a chromium nucleating layer on an oxidized silicon wafer, surface roughness increases almost linearly with increasing film thickness, and the grain size of the tungsten layer also increases with increasing thickness. The diameters of the largest grains are comparable to the CVD tungsten film thickness. FIG. 12 illustrates this relationship by plotting RMS surface roughness ranging from 0 to 70 nm against tungsten film thickness ranging from 0 to 0.5 μm. With this relationship, it is possible to determine CVD metal film thickness as a function of scattering parameter, $S_r$. Similar surface roughness versus film thickness relationships can be obtained for other CVD polycrystalline films such as polysilicon. In summary, the measurements of coherently reflected power, $P_{cr}$, and scattered reflected power, $P_{sr}$, can determine the thickness of CVD polycrystalline metal as well as other polycrystalline films on semiconductor wafers.

Figure 13:
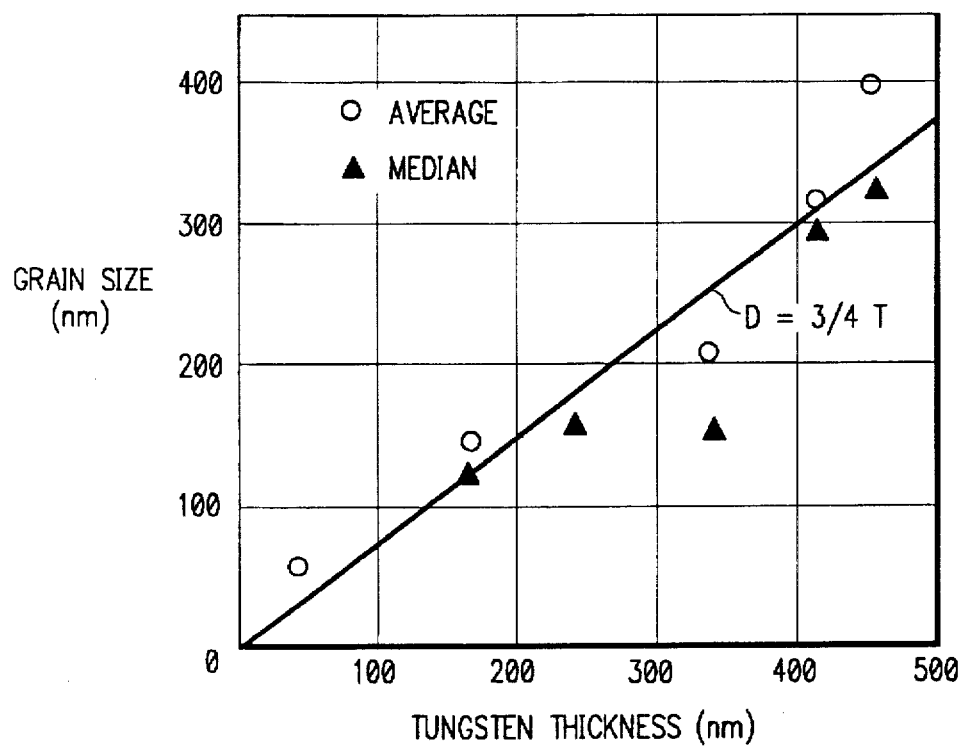
FIG. 13 is a plot of CVD tungsten film average grain size as a function of tungsten film thickness (measured data points)

KAMINS indicates that, at least to a first-order of magnitude, a linear relationship exists between tungsten film thickness and tungsten film average grain size. FIG. 13 illustrates this relationship showing tungsten thickness ranging from 0 to 500 nm and grain size ranging from 0 to 450 nm. FIG. 13 illustrates that with increasing CVD tungsten film thickness, average grain size increases almost linearly.

In determining the reliability of the method and apparatus of the present invention, it is also important to understand the relationship between CVD process temperatures and RMS surface roughness of CVD polycrystalline metal or other polycrystalline layers deposited by the CVD process. Depending on the variance in CVD layer surface roughness with deposition temperature, temperature-dependent calibrations of the roughness-thickness relationship may be necessary. The plot of FIG. 14 shows data for spectral surface reflectance on samples deposited over the temperature range from 250° to 375° C., using either chromium or bulk silicon to promote nucleation of tungsten.

FIG. 14 shows the measured signal, A ($=-2 \log_{10}R$) at a wavelength of 450 nm as a function of CVD tungsten film thickness for samples deposited at different temperatures. The deposition temperature is indicated for each sample. FIG. 14, however, shows that RMS surface roughness increases only as a function of thickness and appears to be relatively independent of the CVD tungsten progress temperature. No significant difference in surface roughness is apparent between the two CVD films that were formed at different temperatures. Because film thickness is more important than process temperature, as long as the process time is adjusted to deposit the film of the desired thickness, surface roughness would be a good measure of the film thickness. This is because the value A shown in FIG. 14 depends on the surface roughness value. With these relationships, it is possible to extend the usefulness of the physical property measurements of the present invention to more complex configurations and an extended range of CVD processes. Even in CVD processes where the surface roughness for a given film thickness is dependent on the deposition temperature, it is possible to set up calibration look-up tables for a range of temperatures.

Figure 15:
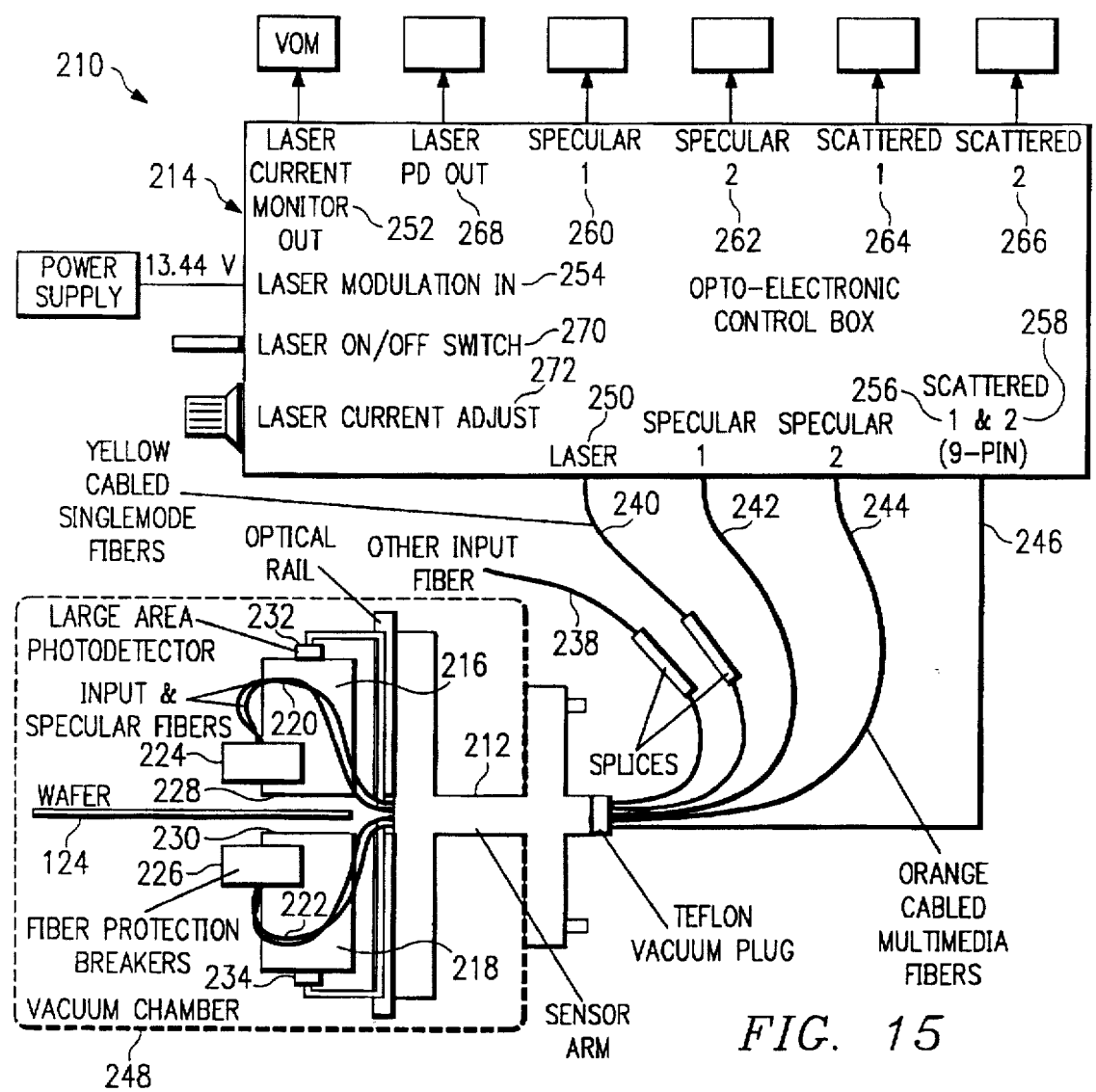
FIG. 15 shows the schematic diagram of a fiber-optic scatter sensor system incorporating the preferred embodiment of the present invention.

A schematic diagram of FIG. 9 has been embodied in a scattering sensor system that FIG. 15 describes. The surface roughness system 210 of FIG. 15 is comprised of a sensor arm 212 and an opto-electronic control box 214. The sensor arm 212 consists of two essentially identical sensor heads 216 and 218 facing each other. Each sensor head 216 and 218 contains two-fiber optical cables 220 and 222, aspherical collimating focusing lenses at 228 and 230, scattered light focusing lenses at 228 and 230, and large area germanium photodiode devices 232 and 234, all respectively. The two laser transmitting optical fibers 238 and 240 and the specular photodiode fibers 242 and 244 for sensor heads 216 and 218, respectively, are routed through the sensor arm 212 in load-lock chamber 248 and connect to opto-electronic control box 214, where they are cabled and connectorized. The opto-electronic control box 214 contains outputs for monitoring the driving current of a 1.3 μm laser diode 252, laser drive and modulation interface circuit 254, two InGaAs photodetectors (not shown) for specular beam measurements, and outputs for the two specular 260 and 262, two scattered 264 and 266, and the laser diode's internal photodetector signals 268. Electrical cable 246 carries the scattering detector signals to opto-electronic control box 214.

To fabricate the system of FIG. 15, various components may be used. Parts which must be separately machined include sensor support arm 212, sensor heads 216 and 218, and holders for the collimating and focusing as well as scattered beam lenses. However, the preferred embodiment of the present invention uses the commercially available components listed in Table 1 as follows:

TABLE 1

| Part Names | Source | Part No. | Qty |
| --- | --- | --- | --- |
| Translation Carrier | Newport | MTF | 2 |
| Optical Rail | Newport | MRL-9-VC | 2 |
| Aspheric Lens Holder | — | — | 2 |
| Aspheric Lens | Rolyn Optics | 17.1010 | 2 |
| Biconvex Lens | Newport | XBX043-AR18 | 2 |
| Germanium Photo-detector | Gs. Power Devices | GM-8 | 2 |
| Ceramic Adhesive | Aremco | 569 | 1 oz |
| FC-PC SMF Cable | Ficon | 5-08-6B-6B-3 | 3 m |
| 100/140 S1 Cable Fiber | Spectran | — | 3 m |
| Teflon Vacuum Plug | — | — | 1 |
| 125 μm ID Capillary Splice | NEO | — | 2 |
| Electronics Box | ITT Pomona | — | 1 |
| FC Connectorized | MRV | MRLD-FC-1 | 1 |

TABLE 1-continued

| Part Names | Source | Part No. | Qty |
| --- | --- | --- | --- |
| 1.3 μm LD ST Connectors | ETS | STC-B140-2151 | 2 |
| ST Receptacles | ETS | 300-4STC-0001 | 2 |
| Isolated BNC Connectors | — | — | 7 |
| ON/OFF Switch | — | — | 1 |
| 1K Potentiometer | — | — | 1 |
| 9-pin Connector | — | — | 1 |
| InGaAs Photodetector | Fujitsu | FTD12Z32TU | 2 |

The system 210 of FIG. 15 uses DC drive or AC drive/modulation of the laser diode for semiconductor wafer measurements. The sensor system 210 has symmetrical heads. It is possible to guide the laser beam either towards the lower sensor head (fiber 240) or towards the upper sensor head (fiber 238). Operation of the system 210 to determine the coherent and scattered reflection and transmission of a semiconductor wafer is straightforward once the laser diode current is set and the wafer holder aligns and centers the wafer with respect to sensor heads 216 and 218. FIG. 16 shows the schematics of the laser diode drive and specular photodetector circuits. AC modulation of the laser source may be performed in order to enhance the signal-to-noise and measurement accuracy by lock-in amplification.

To set the laser diode 144 current, the following steps are performed:

Laser switch 270 is turned off, and the laser current potentiometer 272 is set to a minimum value. A high impedance voltage meter connected to the laser current monitor 252 output and an optical power meter, may be connected to all five photodetector outputs (260 through 268). Finally, a laser drive modulation source such as a DC or an AC power supply is connected to the laser modulation input 254. At this point it is important to assure that the maximum output voltage of the modulation source with a 220 ohm load does not exceed 13.44 volts. It is important to note that the load on the modulation source is in the range of 220 to 1220 ohms, depending on the laser current potentiometer. Next, it is necessary to connect one of the laser output cables 240 or 258 to the sensor. The next step is to turn laser switch 270 on.

The laser current monitor should have a peak voltage of about 2.24 volts and the laser photodiode should have an output of around 1.77 microamps. The next step is to turn up the laser current slowly to a maximum, while making sure that the peak laser current monitor voltage does not exceed 11.66 volts. The laser pulse diode 268 should have an output of about 250 microamps.

Preliminary characterization results using test wafers in the scattered sensor system of FIG. 15 are shown in Table 2 below:

TABLE 2

| Sample # | Wafer Side Toward Input | Laser Input Side # | Spec 1 | Spec 2 | Scat 1 | Scat 2 | Comments |
| --- | --- | --- | --- | --- | --- | --- | --- |
| None | — | None | −5 pA | −7 pA | 50–250 pA | 50–250 pA | Dark Currants |
| None | — | 1 | −106.6 μA | −633.3 μA | −5.295 μA | −3.379 μA | Can be used as Reference Levels |

TABLE 2-continued

| Sample # | Wafer Side Toward Input | Laser Input Side # | Spec 1 | Spec 2 | Scat 1 | Scat 2 | Comments |
|---|---|---|---|---|---|---|---|
| None | — | 2 | −750 μA | −4.20 μA | −4.20 μA | −7.25 μA | Can be used as Reference Levels |
| Si-1 | Polished Front-side | 2 | −30 μA | −251.9 μA | −145.1 μA | −60.08 μA | Bare Silicon Wafers |
| Si-1 | Rough Backside | 1 | −179 μA | −26.37 μA | −44.56 μA | −137.0 μA | |
| Si-2 | Polished Front-side | 2 | −33.58 μA | −252.8 μA | −144.3 μA | −58.14 μA | |
| Si-2 | Rough Backside | 1 | −38.48 μA | −28.84 μA | −119.5 μA | −139.2 μA | |
| CVD-W (1) on Si | Glossy (metal) | 2 | 13 pA | −472 μA | −1.4 nA | −111.11 μA | CVD tungsten on Silicon Wafers |
| CVD-W (2) on Si | Glossy (metal) | 2 | 14 pA | −365 μA | −1.2 μA | −27.9 μA | |

The photodetector currents that Table 2 shows were obtained when the laser current monitor output was set at 10.75 volts.

To operate the apparatus of the present invention, the wafer must be properly located equidistant between the sensor heads and tilt of the semiconductor wafer must be reduced to as close to zero as possible to assure that all the specular energy is collected by the focusing lenses and all scattered energy is properly imaged to the scattered photodetectors. This assures that coherent reflection from the semiconductor wafer and coherent transmission through the semiconductor wafer properly returns only to the coherent reflected and transmitted beam detectors. If this does not occur, a significant error and signal cross-talk results in reflectance and transmittance as well as scattering parameter measurements.

Figure 17:
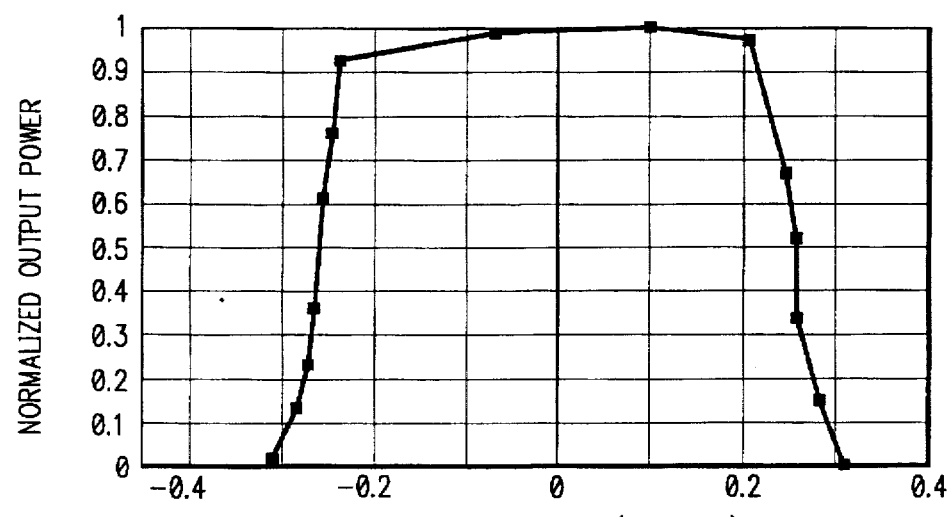
FIG. 17 is a plot of the specular reflection as a function of wafer tilt using the system of FIGS. 15 and 16 (measured data points)

FIG. 17 provides a plot of specular reflection as a function of wafer tilt to provide preliminary characterization results using sample wafers and the system 210 of the FIG. 15 embodiment. Along the ordinant of FIG. 17 shows the measured normalized specular power signal from sensor head 216 ranging from 0 to 1; the abscissa shows relative wafer tilt angle in degrees from −0.4 to +0.4 with respect to the actual normal vector or specular vector for the wafer at the point of incident power. FIG. 17 shows that within the range of approximately −0.2 to approximately 0.2 degree tilt angle virtually all of the specular output power for the coherent reflected or transmitted laser beam is collected by specular fibers 220 and 222. As FIG. 17 illustrates, with the system 210 of FIG. 15, as long as the relative tilt angle at least falls within ±0.2 degree, all of the specular or coherent reflected and transmitted beam powers that the semiconductor wafer reflects and transmits will be sensed as specular inputs to specular fibers 220 and 222.

In aligning a wafer holder to the sensor heads 216 and 218, the following steps are taken. First, place a polished silicon wafer on the holder and position it between the heads 216 and 218. Next, connect the laser 1 cable 238 to the laser output 268 and optimize the wafer tilt to maximize the specular 1 260 output. Next, connect the laser 2 cable 240 to the laser output 268 and, if necessary, fine tune the wafer tilt to peak the specular 2 output 262. Reiteration of the previous connection steps may be necessary to obtain the optimal tilt for both laser input directions.

Figure 18:
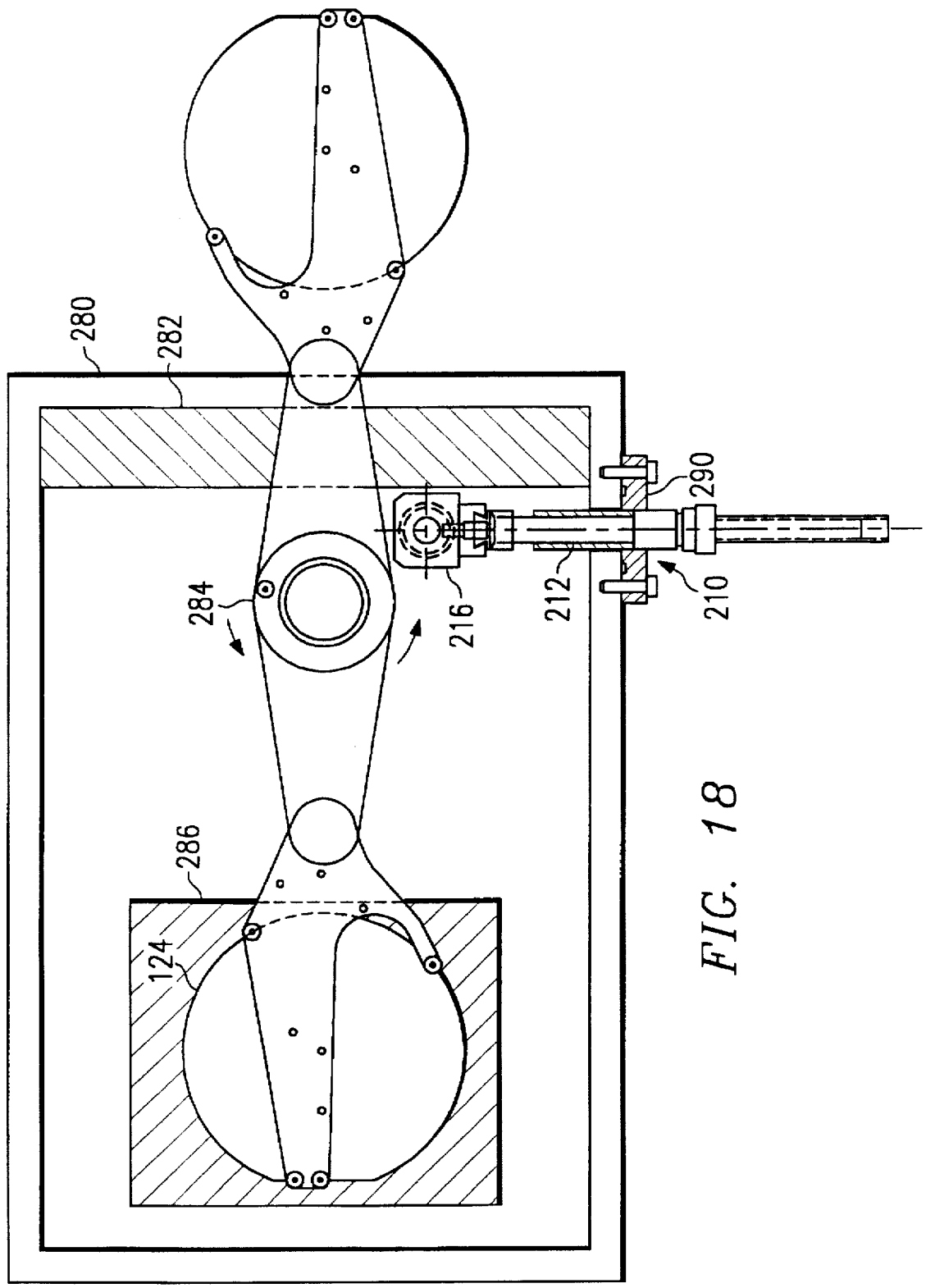
FIGS. 18 and 19 illustrate the implementation of the present invention in a vacuum load-lock chamber of an automatic vacuum processor (AVP) used for single-wafer processing.
Figure 19:
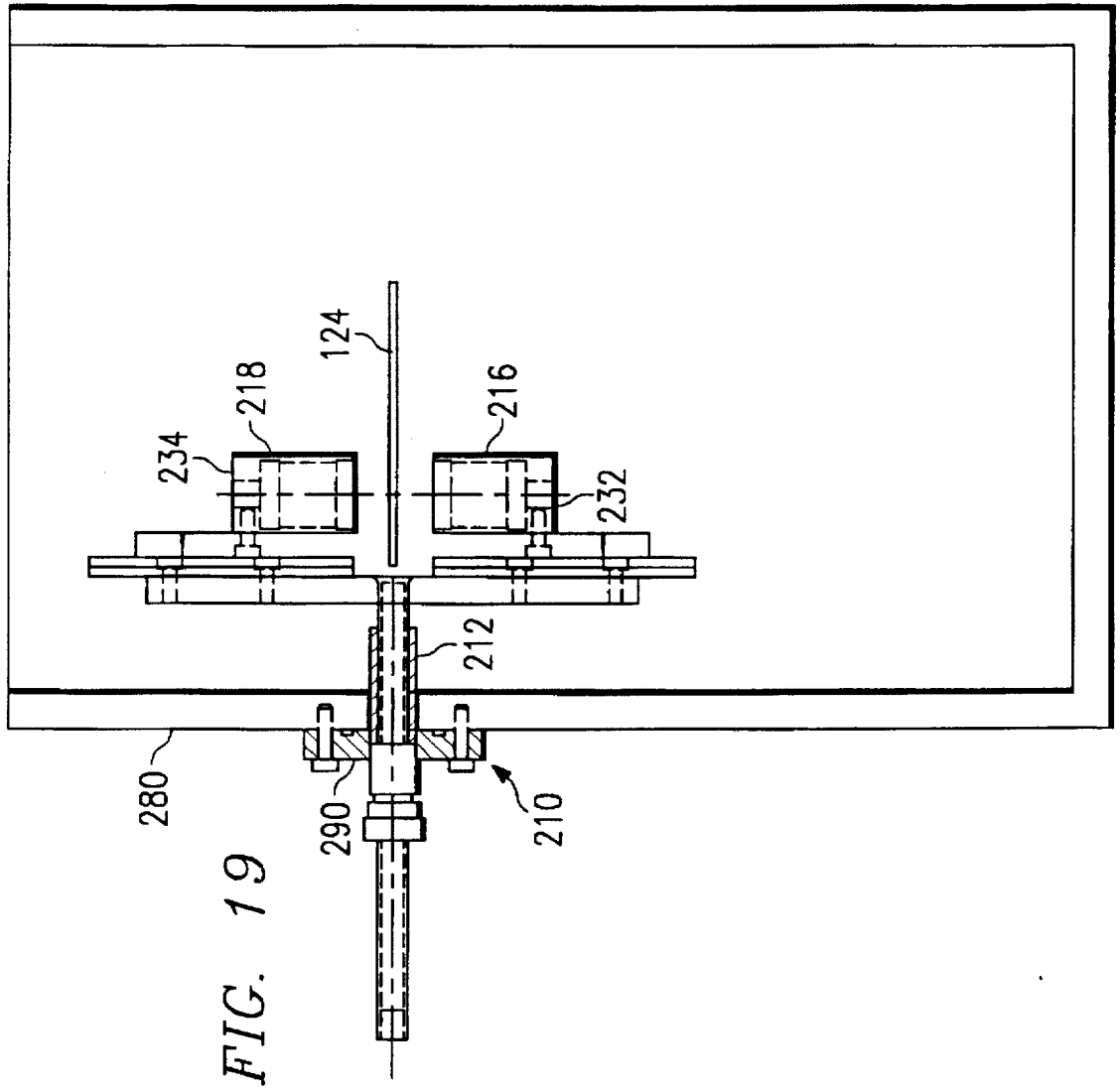

To provide a path for maintaining proper wafer position and tilt for surface roughness measurements, the present invention may be implemented in a load-lock or dedicated sensor chamber. FIGS. 18 and 19 illustrate implementation of the sensor system of the present invention within a load-lock chamber of an Automated Vacuum Processor (AVP) manufactured by Texas Instruments of Dallas, Tex. FIG. 18 provides a top down view of the sensor system of the present invention implemented in an automated vacuum processor or AVP load-lock chamber. Within load-lock chamber wall 280 appear process chamber isolation gate mechanism 282, wafer handling robot 284, and wafer boat 286. Wafer handling robot 284 picks up a single semiconductor wafer 124 at metal boat 286 and by rotation transports wafer 124 through load-lock chamber 280 and isolation gate mechanism 282 to have the wafer 124 enter into a semiconductor wafer process chamber (not shown) of a fabrication reactor. Through vacuum tight seal 290, the sensor system 210 of the present invention penetrates into load-lock chamber 280.

As wafer handling robot 284 passes semiconductor wafer 124 through load-lock chamber 280, semiconductor wafer 124 passes by sensor system 210 between sensor heads 216 and 210. FIG. 19 illustrates the passage of semiconductor wafer 124 through the sensor heads 216 and 218 to establish the point at which RMS surface roughness measurements can be made using the method of the present invention. This sensor system can also perform multi-point measurements on a wafer. It is also possible to employ two diode laser sources with the sensor system of this invention in order to provide laser beam power simultaneously to the two sensor heads. The two laser sources may be modulated at two different frequencies. The two-frequency modulation will allow simultaneous measurements of the reflectance, transmittance, spectral emissivity, and scattering parameter values for laser beams incident on both sides of a semiconductor wafer. This approach, for instance, allows simultaneous measurements of the CVD polycrystalline film thickness and wafer backside roughness on a wafer with a CVD polycrystalline film. The use of two different frequencies (frequency-division multiplexing or FDM) permits these simultaneous measurements without any signal cross-talk. It is also possible to use time-division multiplexing (TDM) of the two incident laser beams in order to perform simultaneous measurements without signal cross-talk. In the case of FDM, each detector channel contains an electrical signal with two frequency components. These signals can be easily separated by filtering.

Figure 20:
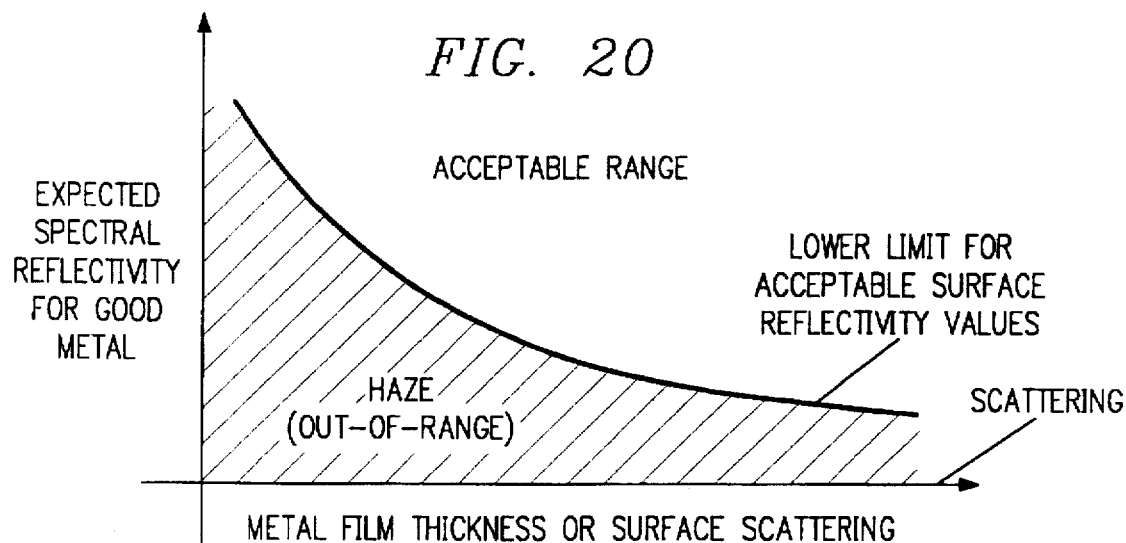
FIGS. 20 and 21 are characteristic plots illustrating use of the present invention for semiconductor wafer processing diagnosis.

FIG. 20 provides a graph of expected total spectral surface reflectivity for a CVD tungsten film versus metal film thickness (or measured surface scattering) to establish a lower limit for acceptable surface reflectivity values. The graph of FIG. 20 shows an application of the present invention to qualitatively assess the operation of a semiconductor wafer fabrication reactor. The sum of the coherently reflected power, $P_{cr}$, and scattered reflected power, $P_{sr}$, can be used to estimate the total spectral reflectivity for a metal surface, such as tungsten, on a semiconductor wafer. These measured values are also used to extract the scattering parameter, $S_r$, which is a measure of the CVD film thickness or surface roughness. This information is particularly useful for process diagnostic applications. For example, the residual vacuum contaminants such as oxygen, water, or other contaminants caused by a leak may cause haze on metallic films deposited by sputtering or during a CVD process. The presence of haze can be detected by measuring the spectral surface reflectivity and scattering values. For hazy surfaces, the total reflectivity would be rather small. Thus, for given metal film thickness, if the spectral surface reflectivity that the sensor system of the present invention measures falls below the expected curve for the lower limit of acceptable surface reflectivity values, the present invention could indicate a process chamber leak or other processing system malfunction. The qualitative curve of FIG. 20 indicates larger surface reflectance values for lower values of metal film thickness or measured scattering because expected spectral reflectivity for tungsten and other CVD metals is greater when CVD metal film thickness is smaller. The shape of reflectance-versus-scattering curve may be different for different CVD and PVD processes.

Figure 21:
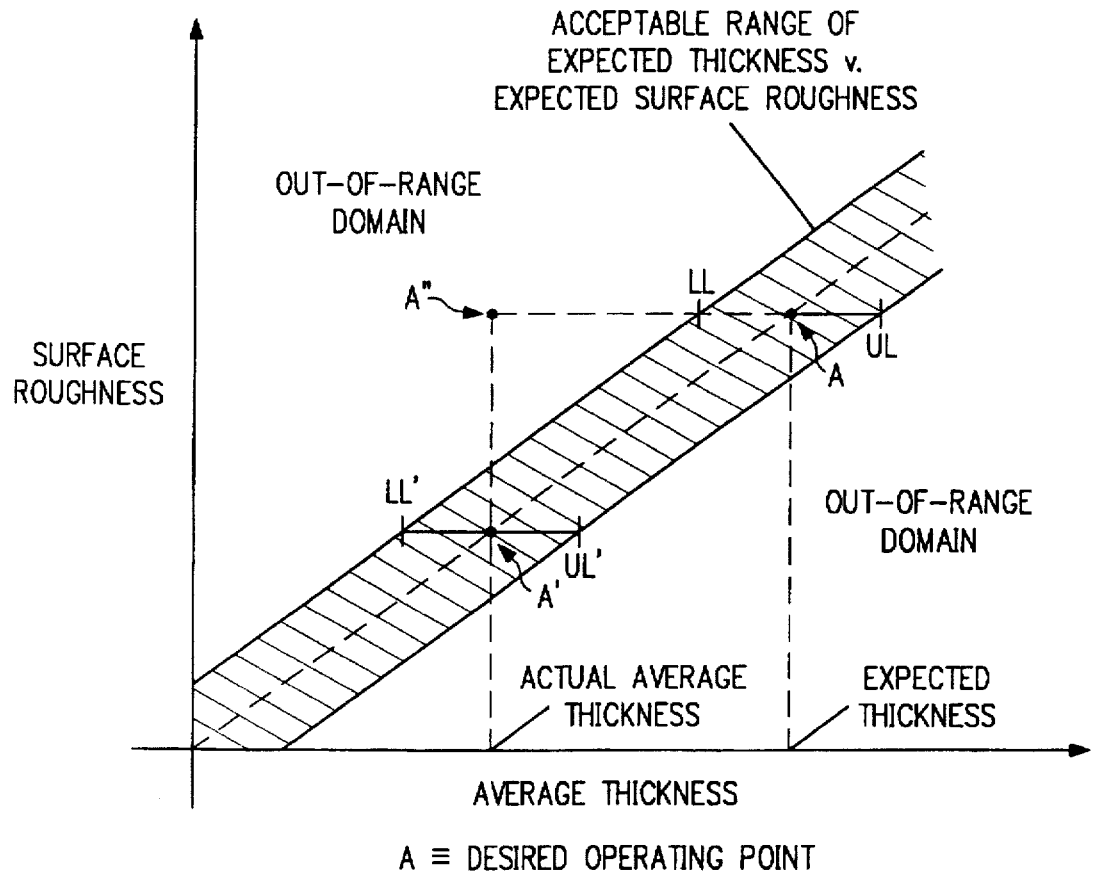

FIG. 21 further illustrates use of the present invention for deposition process diagnosis. In depositing metal or other polycrystalline thin films on a semiconductor wafer, if process and equipment conditions do not satisfy expected recipe values, the expected relationship between deposited film surface roughness (corresponding to average grain size) and thickness may not be satisfied. In fact, in some cases it is possible to have lower than expected values of surface roughness for a particular metal or polycrystalline film. This does not necessarily mean that the total surface reflectance is degraded, but as the surface roughness increases, scattering characteristics of the semiconductor wafer are changed.

FIG. 21 illustrates a graph of expected average thickness versus expected film surface roughness for a given CVD process. It conceptually shows a range of expected thickness values for a semiconductor wafer material layer versus layer surface roughness. The graph of FIG. 21 can be used, for example, in a particular process to ensure that the expected or desired thickness values track with the actual or measured thickness values for a given value of surface roughness (extracted from surface scattering measurements). Thus, for a given deposition process and a given measurement of surface roughness, for example, at point A", average thickness of the polycrystalline layer should have fallen between the values in the range band of UL and LL indicating, respectively, acceptable upper limit and lower limit values. Point A" itself is out of range and should cause an alarm.

If process parameters are under control, and no vacuum leakage problem or back-side deposition problem exists, average CVD polycrystalline layer thickness will track surface roughness measurements and fall between the LL-UL limits. In other words, surface reflectivity will directly relate to surface roughness measurements and surface roughness measurements are then useful to extract metal film thickness. On the other hand, if process parameters are not under control, spectral surface reflectivity measurements may yield a surface roughness value of A', indicating a lower value of surface roughness and a correspondingly lower range of average thickness between LL' and UL'. As a result, the film thickness may be actually much higher than the surface roughness measurement would indicate. Consequently, if it were determined that the average thickness was greater than the range allowable between LL' and UL', this would mean that the relationship between surface roughness and average thickness did not exist, thus indicating an error in the surface roughness measurement.

Since surface roughness depends on specular, scattered, and total reflectances of the semiconductor wafer, in presence of a process problem the spectral reflectivity will be outside a correspondingly expected range. In terms of FIG. 20, then, the spectral reflectivity would be falling within the area indicated by the word "haze" below the lower limit of acceptable surface reflectivity values. In summary, the combination of FIGS. 20 and 21 show that when spectral reflectivity for a given metal film thickness falls outside the range for acceptable surface reflectivity values an erroneous film thickness measurement based on surface roughness measurement will occur. This will indicate a problem with the fabrication process and identify to the operator a need to determine the source of the problem.

Figure 22:
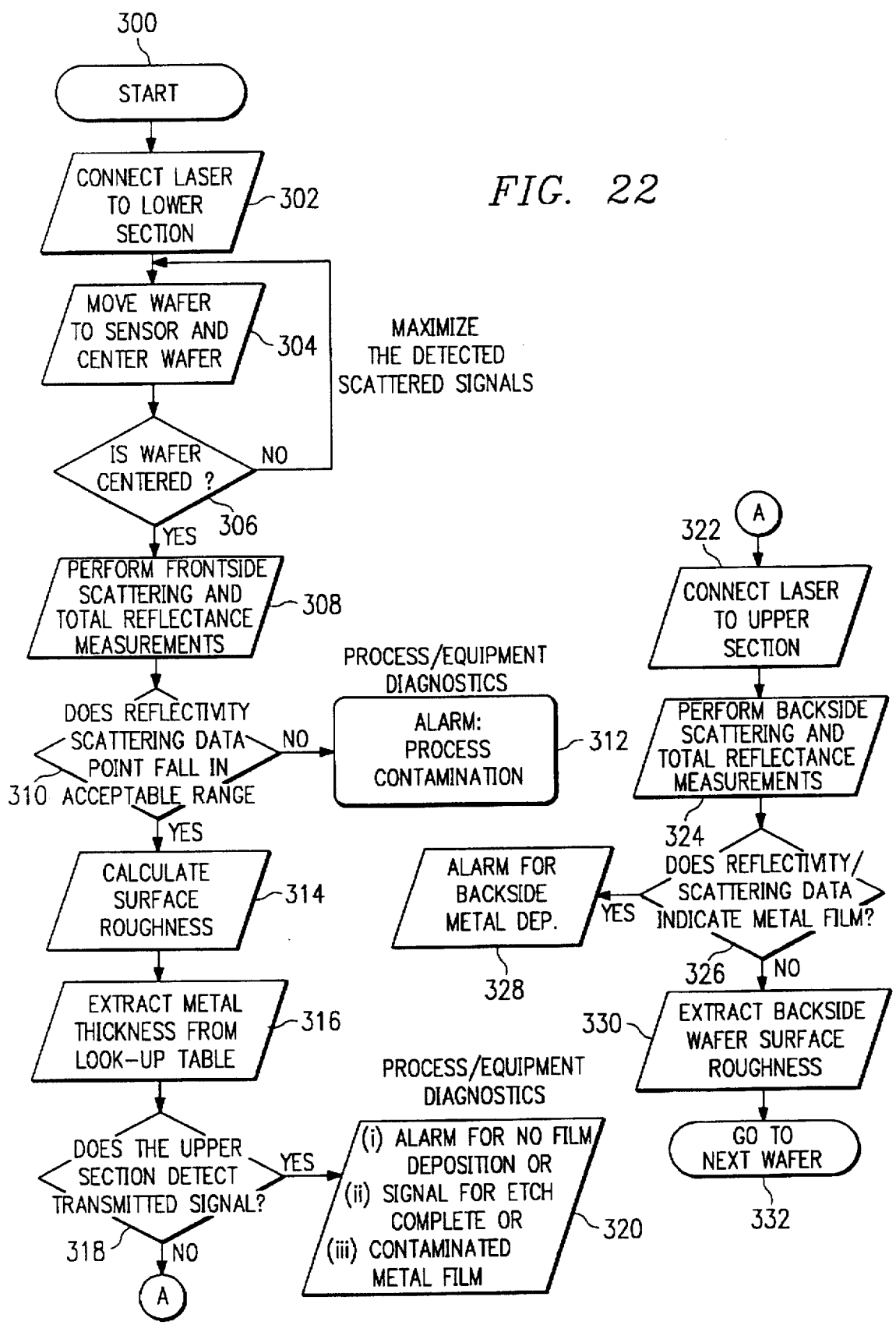
FIG. 22 is a process control flow chart illustrating the use of the surface reflectance measurements for in-situ process and equipment diagnosis and prognosis.

Carrying the concepts of FIGS. 20 and 21 yet further, a process control computer may be programmed to include a process diagnostic algorithm for process control. FIG. 22 illustrates an algorithm for performing such diagnostics and prognostics for use with CVD metal layers. Beginning with the semiconductor wafer in the center position between the system's sensors, the algorithm starts at 300. The next step is connect the laser to the lower section of the sensor system at 302 (assume face-down wafer handling and processing). This can be done by a switch controlling a single laser source, or alternatively, an independent coherent laser source can provide energy to the lower section of the sensor. The next step is to move the wafer to the sensor and center the wafer at 304. The algorithm then queries at 306 whether the wafer is centered and has zero tilt. This can be done by jogging the wafer between two points on each side of its present position and determining if an increase in scattered and/or specular signals occurs. If so, the wafer is not centered and the cycle of moving the wafer to the sensor center and changing its tilt continues until the specular and scattered signals are properly maximized. The next step in the process is to perform a front-side scattering and total reflectivity measurement at 308. Next, a query of whether the reflectivity-scattering data point falls within an acceptable range occurs at 310. This can be done based on comparisons of the measured data with a look-up table similar to the graph shown in FIG. 20. If so, the process continues. Otherwise, an alarm indicating semiconductor wafer fabrication process contamination occurs at 310 and process/equipment diagnostic checks can occur. The next step at 314 in the algorithm is calculate surface roughness using the principles outlined above. The next step is to extract, via a look-up table, the metal film thickness at 316. The next step at 318 is to query whether the sensor at the upper section of the scattered sensor system detects a transmitted signal. If so, process equipment diagnostics perform at 320 one of the following steps:

(1) In the case of a film deposition, produce an alarm to indicate that film deposition at the sensed place did not occur;

(2) In the case of an etch process, signal that the etch process is complete; or (3) In the case of metal film deposition indicate that a contaminated metal film exists (e.g., oxidized metal).

If the upper section sensors do not detect a transmitted signal, the process continues by connecting the laser to the upper section sensor or, alternatively, energizing an already connected upper section laser source at 322. The next step is to perform backside scattering and total reflectance measurements at 324 and then query whether the reflectivity/scattering data indicates a metal film at 326. If so, then the process will alarm at 328 that metal deposition on the backside of the semiconductor wafer has occurred as a process/equipment diagnostic signal. Alternatively, if no metal film is indicated, the next step is to extract the backside semiconductor wafer roughness at 330 and then continue the process on the next semiconductor wafer.

Figure 23:
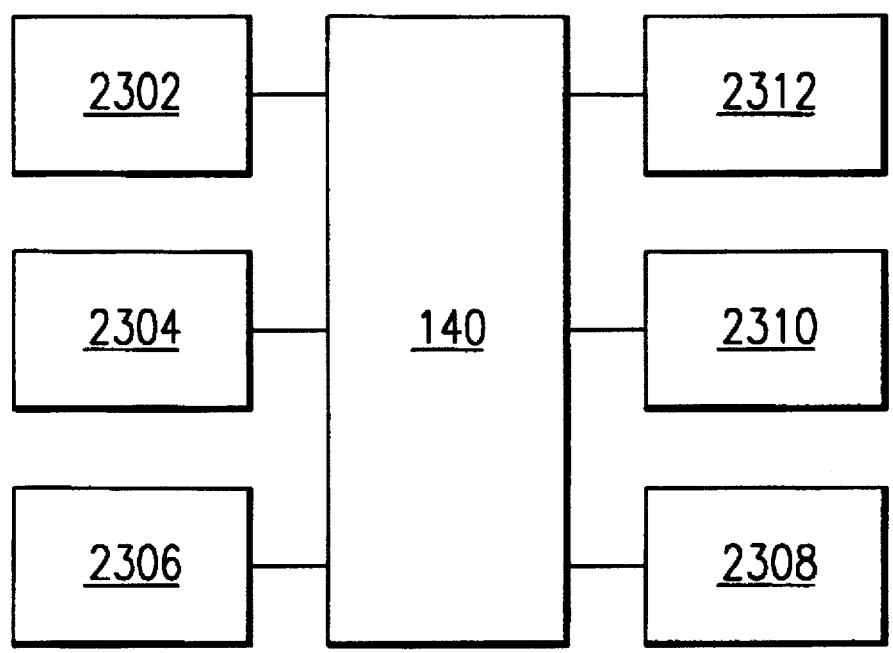
FIG. 23 is a block diagram of another embodiment of the present invention.

Now referring to FIG. 23, block 140 represents either a single apparatus or an entire system for the diagnosis/prognosis of a semiconductor wafer fabrication process. Several circuits can be electrically connected to block 140. These connections may include the $P_{inc}$, $P_{cr}$, $P_{sr}$, $P_{ct}$ and/or $P_{st}$ outputs of block 140. Block 2302 represents circuitry for comparing the reflected electromagnetic power to a reference value; block 2304 represents circuitry for measuring the amount of electromagnetic power scatter reflected from the semiconductor wafer (not shown); block 2306 represents circuitry for determining semiconductor wafer surface roughness as a function of the electromagnetic power; block 2308 represents circuitry for calculating semiconductor wafer metal film thickness; block 2310 represents circuitry for calculating semiconductor wafer polycrystalline film thickness; and block 2312 represents circuitry for controlling a semiconductor fabrication process.

Although the invention has been described with reference to the above specified embodiments, this description is not meant to be construed in a limiting sense. Various modifications of the disclosed embodiment, as will as alternative embodiments of the invention will become apparent to persons skilled in the art upon reference to the above description. It is therefore contemplated that the appended claims will cover such modifications that fall within the true scope of the invention.

What is claimed is:

1. A system for diagnosis and prognosis of a semiconductor wafer fabrication process, said system comprising:

a source of electromagnetic energy;

circuitry for directing electromagnetic power from said source to a semiconductor wafer and collecting reflected electromagnetic power from said wafer;

circuitry for comparing said reflected electromagnetic power to a reference value;

circuitry for measuring the amount of electromagnetic power reflected from said semiconductor wafer;

circuitry for measuring the amount of electromagnetic power scatter reflected from said semiconductor wafer;

a reflection sensor associated with said circuitry for measuring the amount of electromagnetic reflected power while receiving said reflected electromagnetic power and a scatter reflection sensor associated with said circuitry for measuring the amount of electromagnetic scatter reflected power for detecting said scatter reflected electromagnetic power, said scatter reflection sensor comprising an imaging lens for focusing said scatter reflected electromagnetic power to said scatter reflection sensor; and circuitry for calculating the thickness of a layer formed over said semiconductor wafer.

2. The system of claim 1, further comprising circuitry for determining semiconductor wafer surface roughness as a function of said electromagnetic power, said reflected electromagnetic power, and said scatter reflected electromagnetic power.

3. The system of claim 1, wherein said layer formed over said semiconductor wafer is comprised of polycrystalline silicon, and wherein said thickness measurement is based on measurements of surface roughness.

4. The system of claim 1, wherein said layer formed over said semiconductor wafer is comprised of a metal, and wherein said thickness measurement is based on measurements of surface reflectance.

5. The system of claim 1, wherein said reference value is an expected value for reflected electromagnetic power for a given semiconductor wafer film thickness.

* * * * *